(12) United States Patent  
Emery et al.

(10) Patent No.: US 9,125,305 B2  
(45) Date of Patent: Sep. 1, 2015

(54) DEVICES WITH PNEUMATIC, HYDRAULIC AND ELECTRICAL COMPONENTS

(75) Inventors: Keith E. G. Emery, San Diego, CA (US); Thomas Jones, Escondido, CA (US)

(73) Assignee: Delta Design, Inc., Poway, CA (US)

( * ) Notice: Subject to any disclaimer, the term of this patent is extended or adjusted under 35 U.S.C. 154(b) by 929 days.

(21) Appl. No.: 13/046,593

(22) Filed: Mar. 11, 2011

(65) Prior Publication Data

US 2011/0228489 A1 Sep. 22, 2011

Related U.S. Application Data

(60) Provisional application No. 61/314,950, filed on Mar. 17, 2010.

(51) Int. Cl.
| | |
|---|---|
| H05K 7/02 | (2006.01) |
| H05K 7/06 | (2006.01) |
| H05K 7/08 | (2006.01) |
| H05K 7/10 | (2006.01) |
| H05K 1/02 | (2006.01) |
| H05K 1/18 | (2006.01) |
| H05K 3/46 | (2006.01) |

(52) U.S. Cl.
CPC .............. *H05K 1/0272* (2013.01); *H05K 1/185* (2013.01); *H05K 3/4611* (2013.01); *H05K 2201/041* (2013.01); *H05K 2203/162* (2013.01); *Y10T 29/49126* (2015.01)

(58) Field of Classification Search
USPC .......... 361/700–710, 792–795; 204/450–451; 435/6.11–6.12, 702, 350, 173.6, 435/287–288
See application file for complete search history.

(56) References Cited

U.S. PATENT DOCUMENTS

| 5,640,995 | A  * | 6/1997  | Packard et al.  | 137/597 |
|---|---|---|---|---|
| 6,321,791 | B1 * | 11/2001 | Chow | 137/833 |
| 6,488,896 | B2 * | 12/2002 | Weigl et al. | 422/73 |
| 6,488,897 | B2 * | 12/2002 | Dubrow et al. | 422/502 |
| 6,935,772 | B2 * | 8/2005  | Karp et al. | 366/341 |
| 7,192,559 | B2 * | 3/2007  | Chow et al. | 422/504 |
| 7,351,303 | B2 * | 4/2008  | Liu et al. | 156/297 |
| 8,119,304 | B2 * | 2/2012  | Takai et al. | 429/513 |
| 2006/0263873 | A1 * | 11/2006 | Levine et al. | 435/287.2 |
| 2009/0098540 | A1 * | 4/2009  | Baeumner et al. | 435/6 |
| 2009/0207568 | A1 * | 8/2009  | Haveri | 361/699 |
| 2011/0308791 | A1 * | 12/2011 | Overmeyer et al. | 166/250.01 |

* cited by examiner

*Primary Examiner* — Tuan T Dinh  
(74) *Attorney, Agent, or Firm* — Foley & Lardner LLP

(57) ABSTRACT

Method and devices are provided that integrate various internal channels and inlet and outlet ports, configured to operate with air or fluidics, with electrical circuitry. The devices comprise internal channels and outlet/inlet ports that are integrated into multiple layers of printed circuit boards. A multi-layer printed circuit board assembly is produced by laminating the plurality of layers together. The multi-layer printed circuit board assembly can accommodate a variety of off-the-shelf components, as well as electrical circuits and electronic components.

16 Claims, 30 Drawing Sheets

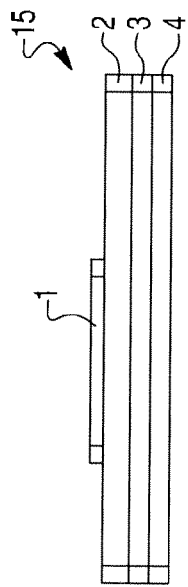
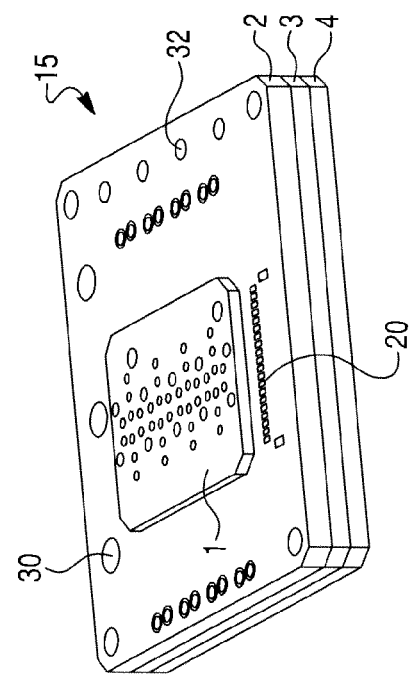
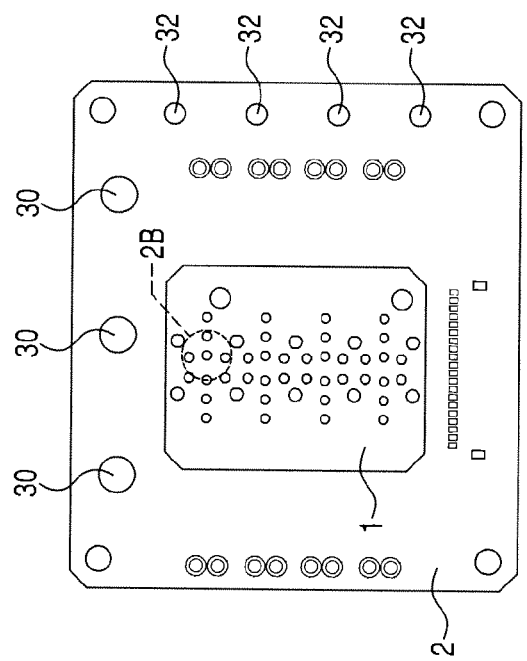
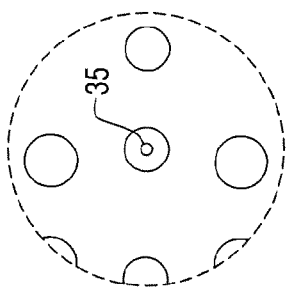

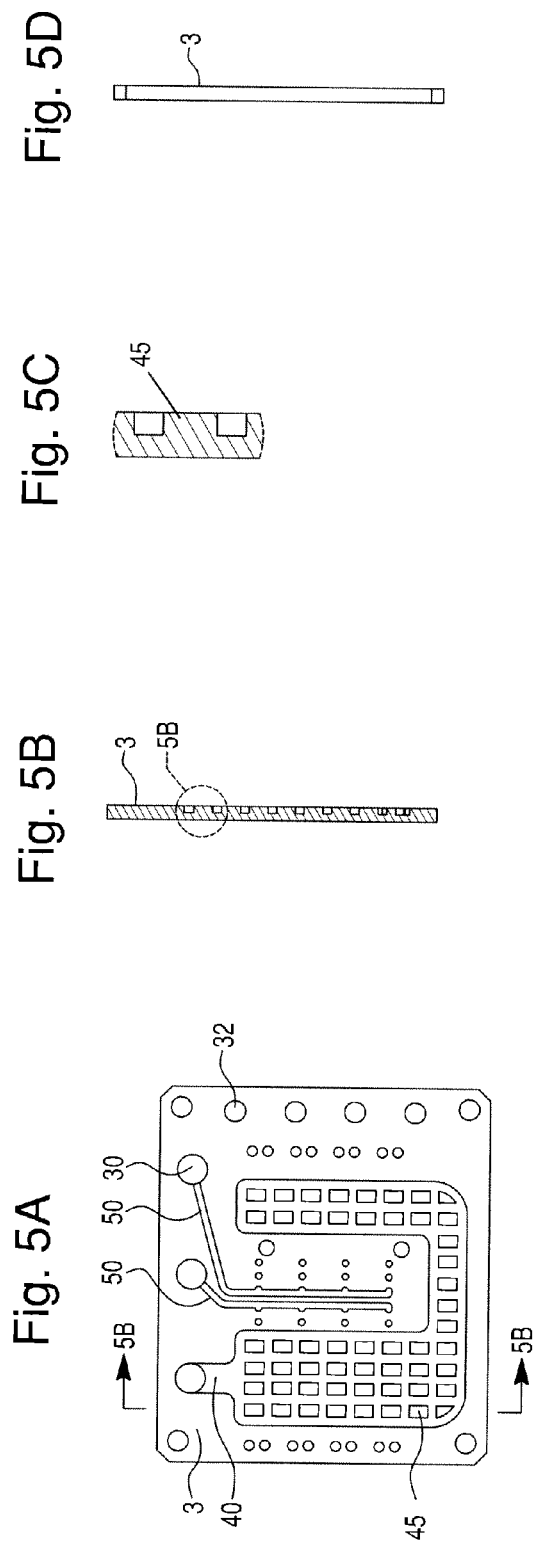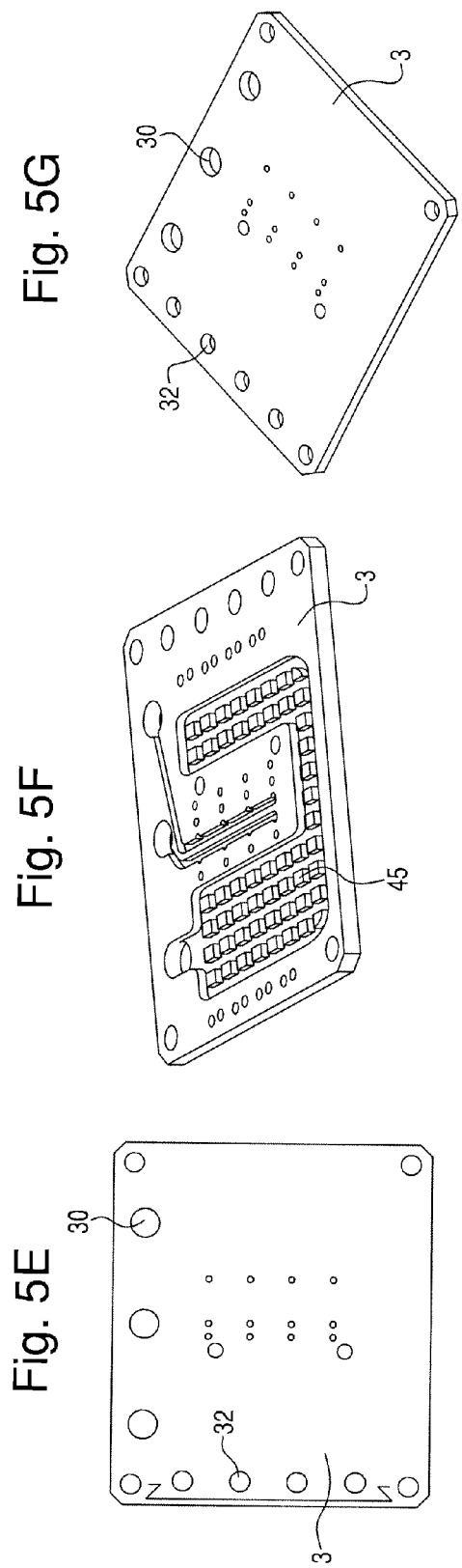

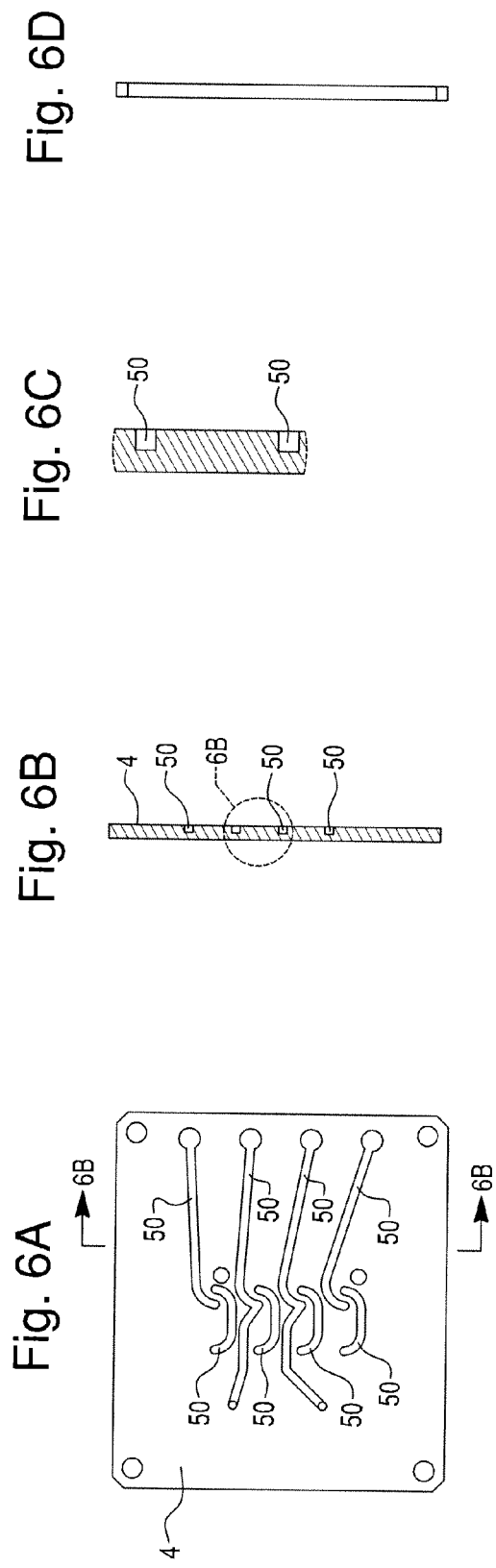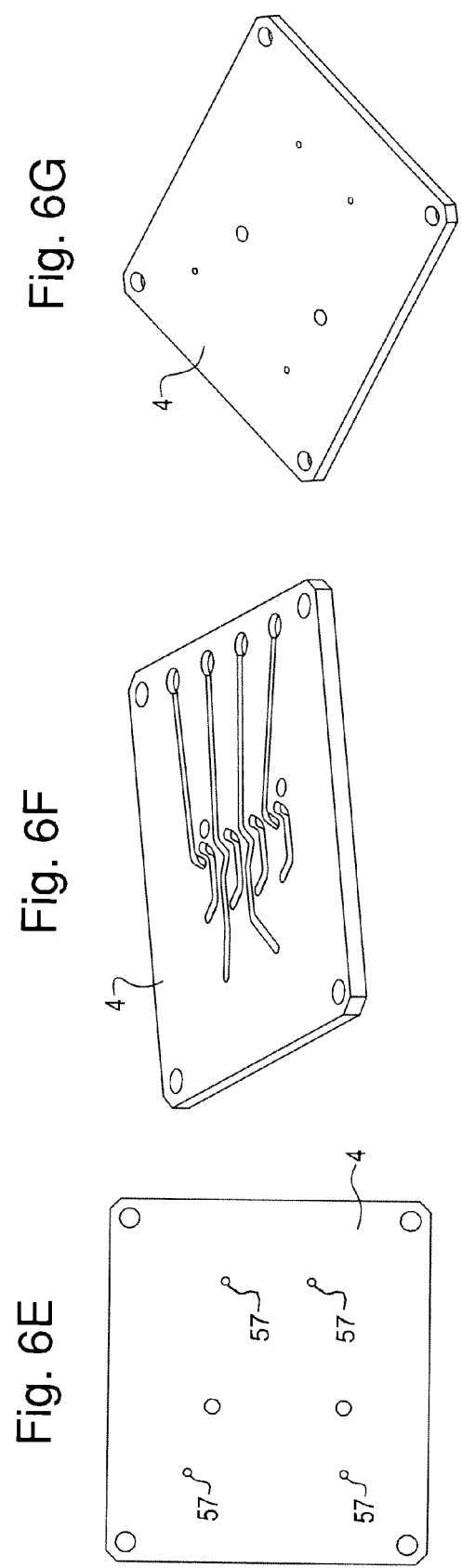

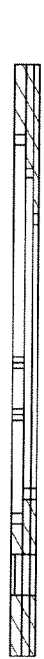
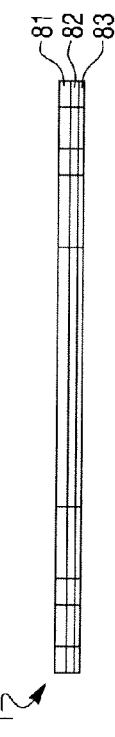
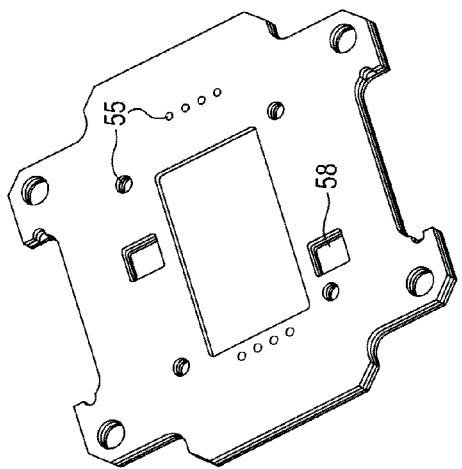
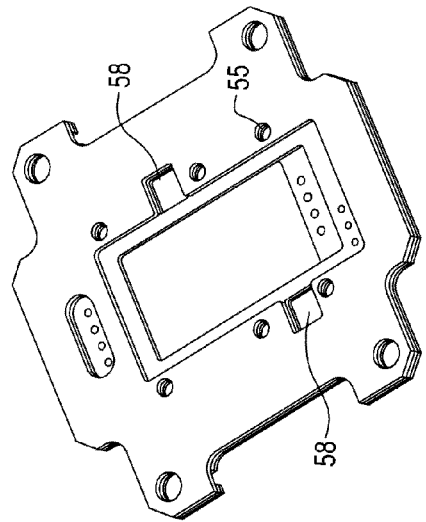
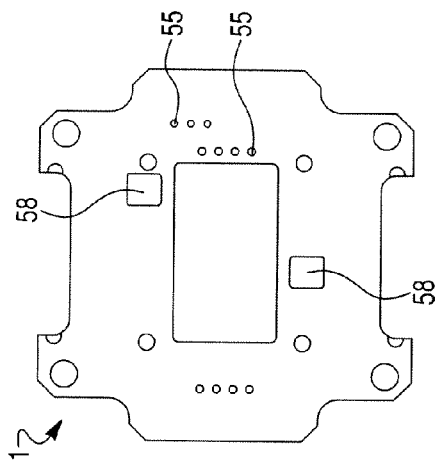
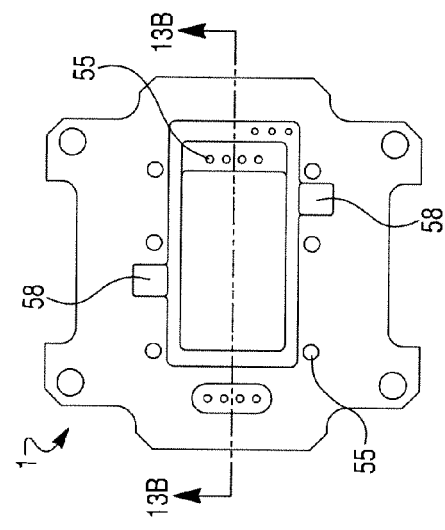

DEVICES WITH PNEUMATIC, HYDRAULIC AND ELECTRICAL COMPONENTS

CROSS-REFERENCE TO RELATED PATENT APPLICATIONS

This instant application claims priority to and benefit of U.S. Provisional Application 61/314,950 filed Mar. 17, 2010, the disclosure of which is incorporated by reference herein in its entirety.

FIELD OF INVENTION

The present invention relates generally to the field of printed circuit boards and devices with air/fluidic channels. More particularly, the present invention relates to manufacturing devices with integrated air and/or fluidic channels and electronic circuitry.

BACKGROUND OF THE INVENTION

This section is intended to provide a background or context to the invention that is recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

In testing electronic components, such as integrated circuits (ICs), a testing apparatus is often utilized to assess a component's performance under thermal stress conditions. The test procedure requires the temperature of the electronic component to be maintained at set points to allow characterization of the chip's performance at several temperatures. To this end, various techniques and devices have been developed to facilitate the maintenance and setting of different temperature points. These techniques and devices, for example, include forced air convection systems, and dual liquid conduction systems. In the latter, a proportion of hot and cold liquids are mechanically metered to affect the desired forcing temperature. In other techniques, the electronic component may be thermally coupled to a heater and a heat sink with a chamber with a liquid flowing through the chamber Regardless of the particular technique, the use of fluids and/or air for achieving and maintaining the set temperatures points, as well as for pick-up and placement of components under test, necessitates the availability of devices that can accommodate air, vacuum and/or fluidic chambers, ports, inlets and outlets in conjunction with electrical connections and additional circuitry such as temperature, vacuum and pressure sensors. Such devices are usually manufactured from cast aluminum, machined aluminum or steel, and pipe or tubing configurations. Some manufacturers may also offer stacked acrylic ported manifolds but lack the associated electronic circuitry and are expensive to produce.

SUMMARY OF THE INVENTION

The disclosed embodiments relate to devices and methods for integrating air and fluidic channels and ports with electrical circuitry that are produced at considerably less cost than conventionally manufactured devices. Further, the devices that are manufactured according to the disclosed embodiments contain features that facilitate thermal stress testing of electronic components. One aspect of the disclosed embodiments relates to a device, comprising a plurality of printed circuit board layers, each successive layer, other than the bottom layer, being stacked on top of another layer to form a multi-layer printed circuit board assembly. The device also comprises one or more inlet or outlet ports integrated into the multi-layer printed circuit board assembly, one or more air or fluid channels internal to the multi-layer printed circuit board assembly, and one or more electrical circuits integrated into the multi-layer printed circuit board assembly.

In one embodiment, the multi-layer printed circuit board assembly is produced by laminating the plurality of printed circuit board layers that are stacked on top of each other. In another embodiment, the device further comprises a blanking plate connected to a bottom layer of the multi-layer printed circuit board assembly. In one example, the device further comprises a sensor adapter configuration connected to a bottom layer of the multi-layer printed circuit board assembly, where the sensor adapter board comprises one or more sensors. The blanking plate, in one example, comprises one or more sensors. For instance, the one or more sensors are selected from a group of sensors consisting of: a temperature sensor, a vacuum sensor, a pressure sensor, and a flow sensor.

According to another embodiment, one or more of the plurality of printed circuit boards comprises a fiber-filled plastic material. For example, one or more of the plurality of printed circuit boards can comprise FR-4, Ultem® 2300 or another engineered plastic material. In still another embodiment, the device comprises a vacuum accumulator internal to the multi-layer printed circuit board assembly. In yet another embodiment, a flow restriction mechanism is integrated into a layer of the multi-layer printed circuit board assembly. In one embodiment, the multi-layer printed circuit board assembly is configured to accommodate off-the-shelf components. For example, the off-the-shelf components are pneumatic components. According to another embodiment, the multi-layer printed circuit board assembly comprises receptacles that are configured to accommodate off-the-shelf components.

In another example embodiment, the one or more inlet or outlet ports and the channels are configured to operate with non-pneumatic fluids. In still another embodiment, the device further comprises one or more sensors integrated into the multi-layer printed circuit board assembly. For example, the one or more sensors are selected from a group of sensors consisting of: a temperature sensor, a vacuum sensor, a pressure sensor, and a flow sensor.

Another aspect of the present invention relates to a method, comprising stacking a plurality of printed circuit board layers on top of each other in a particular order, wherein one or more of the plurality of printed circuit board layers comprise features associated with: one or more air or fluid channels, one or more inlet or outlet ports, and one or more electrical circuits. The method also comprises laminating the stacked plurality of printed circuit board layers to produce a multi-layer printed circuit board assembly with integrated air or fluid channels, inlet or outlet ports and electrical circuits. In one embodiment, the method further comprises drilling orifices in a layer of the multi-layer printed circuit board assembly to effect flow restriction control.

These and other advantages and features of various embodiments of the present invention, together with the organization and manner of operation thereof, will become apparent from the following detailed description when taken in conjunction with the accompanying drawings.

BRIEF DESCRIPTION OF THE DRAWINGS

Embodiments of the invention are described by referring to the attached drawings, in which:

FIGS. 2A to 2E are detailed views of various layers of a multi-layer printed circuit board assembly in accordance with an example embodiment of the present invention;

FIGS. 5A to 5G illustrate top, bottom and side views of a layer associated with a multi-layer printed circuit board assembly in accordance with an example embodiment of the present invention;

FIGS. 6A to 6G illustrate top, bottom and side views of a layer associated with a multi-layer printed circuit board assembly in accordance with an example embodiment of the present invention;

FIGS. 13A to 13F illustrate a layer associated with the device of FIG. 12 in accordance with an example embodiment of the present invention;

DETAILED DESCRIPTION OF CERTAIN EMBODIMENTS

Figure 1C:
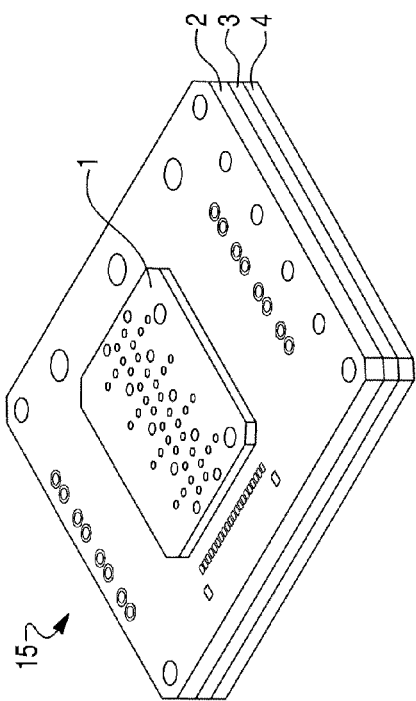
FIGS. 1A to 1D illustrate a multi-layer printed circuit board assembly in accordance with an example embodiment of the present invention.
Figure 1D:
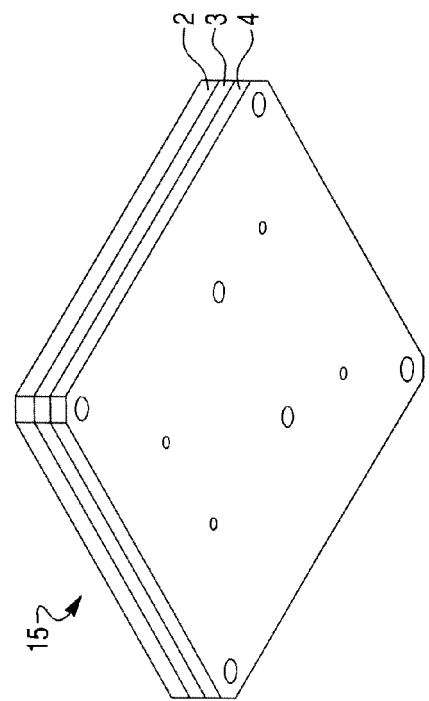
Figure 1A:
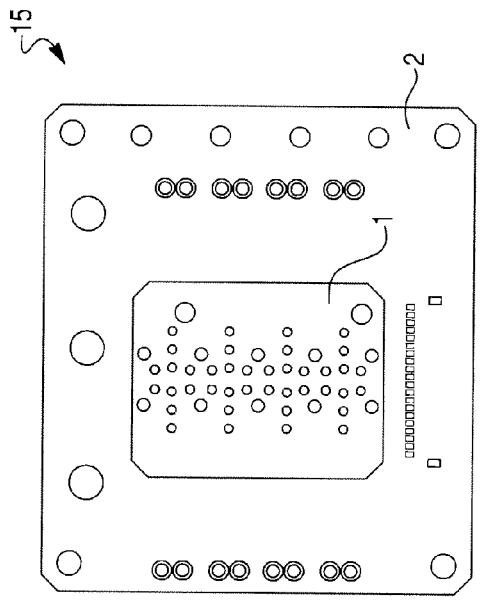
Figure 1B:
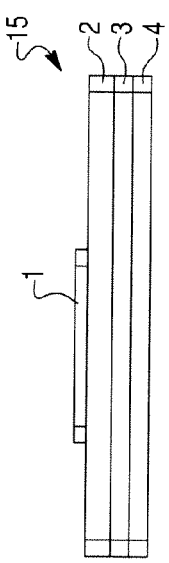

In the following description, for purposes of explanation and not limitation, details and descriptions are set forth in order to provide a thorough understanding of the present invention. However, it will be apparent to those skilled in the art that the present invention may be practiced in other embodiments that depart from these details and descriptions.

Additionally, the word "exemplary" is used throughout this description to mean serving as an example, instance, or illustration. Any embodiment or design described herein as "exemplary" is not necessarily to be construed as preferred or advantageous over other embodiments or designs. Rather, use of the word exemplary is intended to present concepts in a concrete manner. It should be also noted that the term "manifold" is sometimes used in this specification to refer in general to a system of moving fluids or gases is a junction of pipes or channels, typically bringing one into many or many into one.

As noted earlier testing of electronic components through the use of hydraulic and/or pneumatic techniques necessitates the manufacturing of devices that can accommodate manifolds, fluidic chambers, ports, inlets/outlets, and pneumatic and/or hydraulic components, as well as electric power connectivity and electronic devices such as sensors, and the like. In addition, it may be advantageous to configure the various components of such systems as close as possible to each other. For example, by reducing the length of air supply and delivery tubing that is required for operating various pneumatic components, the reaction time associated with the delivery of air or establishing a particular vacuum pressure is reduced. Further, the response time associated with setting and maintaining the desired temperatures or pressures may be reduced by placing the temperature and/or pressure sensors as close as possible to the conduits that carry the air or fluid. It is also important to be able to manufacture such devices in a cost effective manner.

The disclosed embodiments facilitate the manufacturing of such devices that comprise pneumatic and/or fluidic components, as well as electrical connections and electronic circuitry. According to the disclosed embodiments, pneumatic or fluidic components, such as manifolds, can be integrated with a multi-layer printed circuit board (PCB) that contain a variety of internal channels, ports, electrical circuits, and vacuum, pressure and/or temperature sensors. The devices that are produced in accordance with the disclosed embodiments allow for extremely tight packaging of fluid/air routing and control with integrated electrical circuits at a low cost.

According to one example embodiment, multi-layer printed circuit board technology may be used to produce milled porting within each internal layer of a multi-layer printed circuit board. In one example, one or more of the layers is comprised of FR-4 material. In one variation, a fiber-filled plastic or polymer material, such as Ultem® 2300 may be used in addition to, or in place, of FR-4 in one or more layers. For example, the top or bottom layers may comprise Ultem® 2300 or another engineered plastic material. The ports within the sub-layers may be connected via drilled holes in each layer that line up with the mating layers. The separate layers may then be laminated together using a plurality of registration holes. To this end, all of the layers may be registered with pins and then bonded together as one piece. After lamination, all of the unique port connections are internally tied together.

FIG. 1 illustrates top (FIG. 1A), bottom (FIG. 1D) and side (FIG. 1B) views of the exemplary 4-layer printed circuit board assembly 15. In this example embodiment, the top layer, which has smaller dimensions compared to the remaining layers, has been designated as the first layer 1. The layers that are situated directly below the first layer 1 have been designated as the second layer 2, third layer 3 and fourth layer 4, respectively. In this example configuration, the second layer 2, third layer 3 and fourth layer 4 have substantially similar dimensions (i.e., length, width and depth). However, it should be understood that, in general, the layers may have dissimilar dimensions, and the multi-layer printed circuit board assembly 15 may have any number of layers. FIG. 1C depicts a top perspective view of the circuit board assembly 15.

Figure 7A:
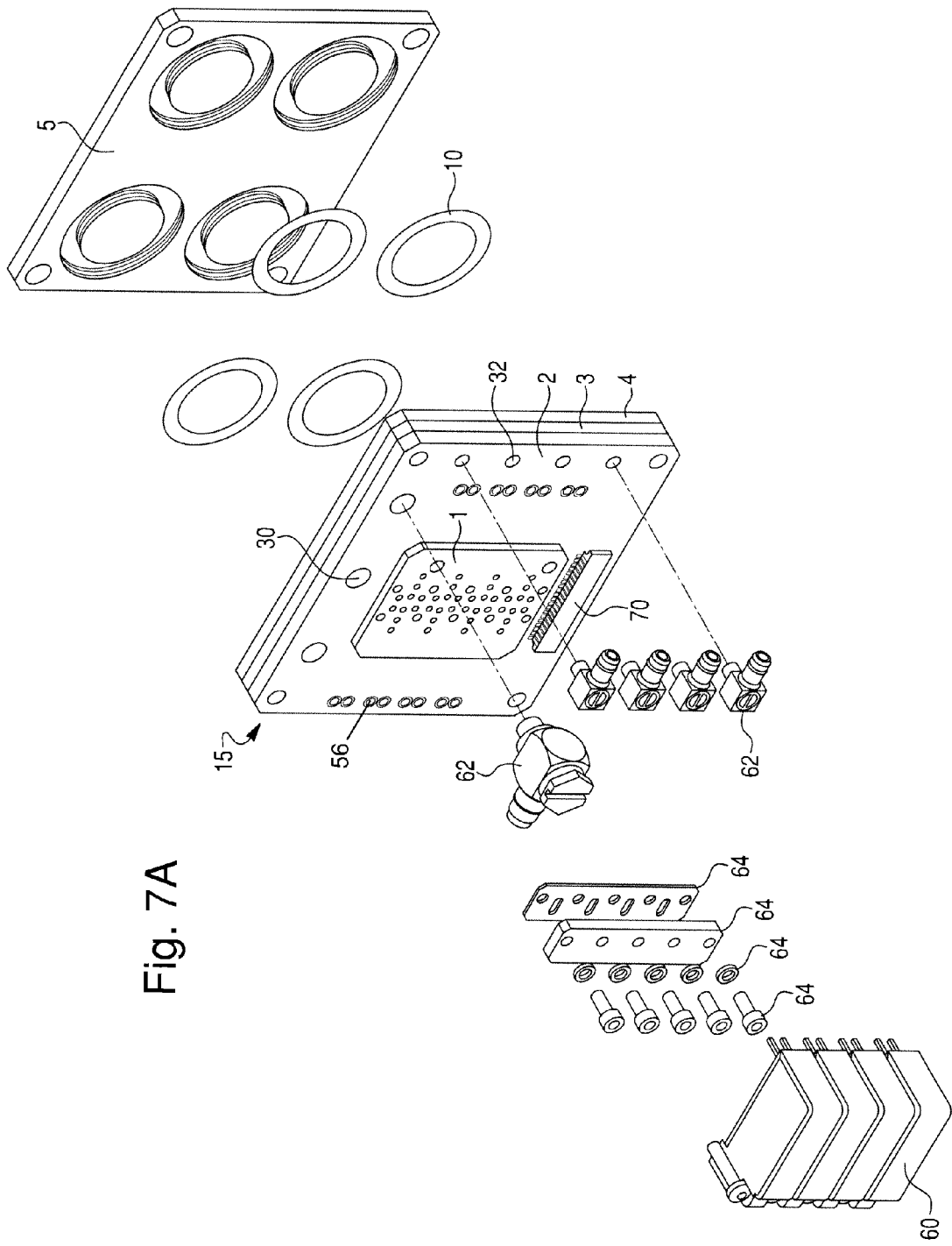
FIGS. 7A to 7B illustrate a device in accordance with an example embodiment of the present invention.

FIG. 2 is another diagram that illustrates all four layers of the multi-layer printed circuit board assembly 15 of FIG. 1. In FIG. 2A, a top-view of the multi-layer printed circuit board assembly 15 is illustrated with the fluid and/or air inlet ports 30 and outlet ports 32 clearly visible. FIG. 2B depicts an inset of the indicated portion of FIG. 2A, showing the first layer 1 of the multi-layer printed circuit board assembly 15 to illustrate built-in orifices 35 that can be used to effect flow restriction/control. For example, the supplier can easily configure the end product at final lamination by drilling smaller or larger orifice sizes. FIG. 2 also illustrates the circuitry 20 on top side of layer 2 that can be used for providing various electrical signals to/from the multi-layer printed circuit board assembly 15. While the depicted circuitry is intended to accommodate a connector 70 (as illustrated in FIG. 7), it should be noted that other electrical connections for accommodating different types of electronic devices and/or connections may also be integrated into the multi-layer printed circuit board assembly 15. In fact, any feature or device associated with conventional printed circuit boards may be incorporated into the multi-layer printed circuit board assembly 15. FIG. 2C is a side view of the circuit board assembly 15. FIG. 2D is a top perspective view of the circuit board assembly 15.

Figure 2E:
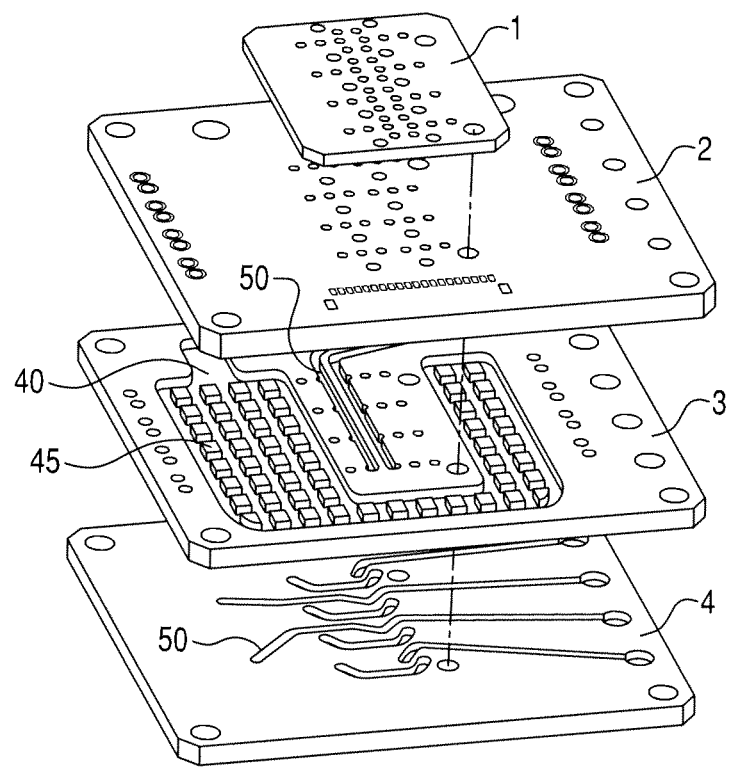
Figure 3A:
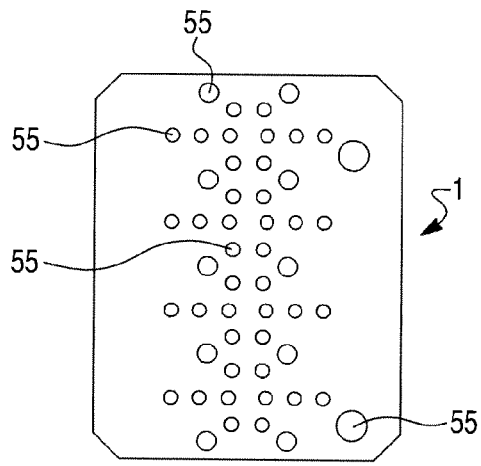
FIGS. 3A to 3E illustrate top, bottom and side views of a layer associated with a multi-layer printed circuit board assembly in accordance with an example embodiment of the present invention.
Figure 3B:
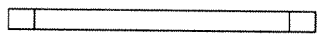
Figure 3C:
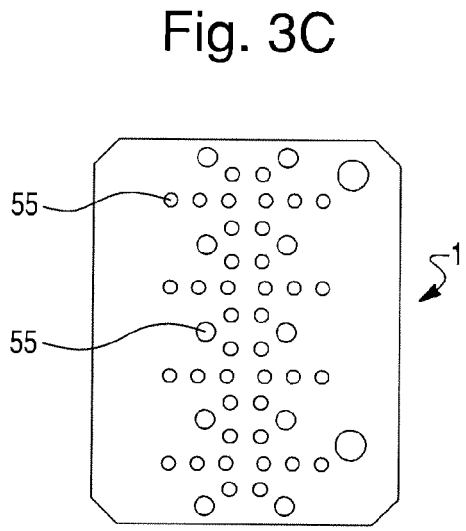
Figure 3D:
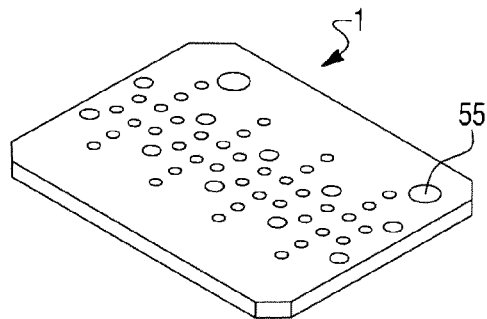
Figure 3E:
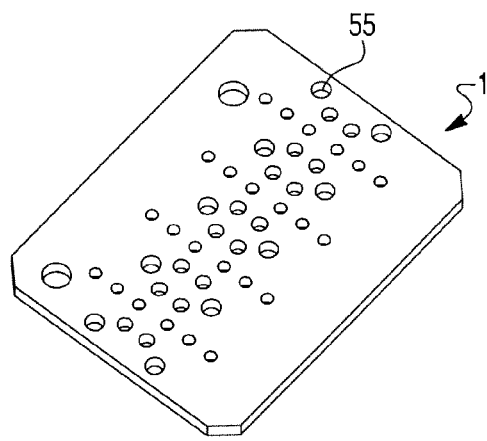
Figure 4C:
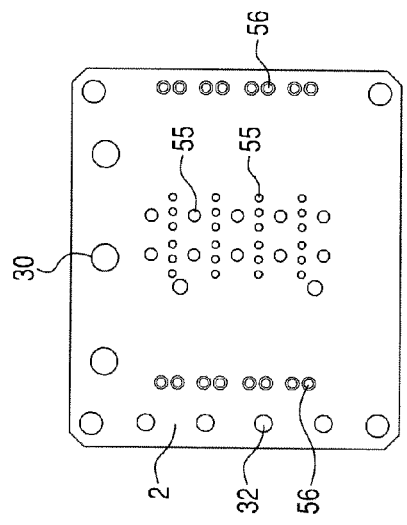
FIGS. 4A to 4E illustrate top, bottom and side views of a layer associated with a multi-layer printed circuit board assembly in accordance with an example embodiment of the present invention.
Figure 4E:
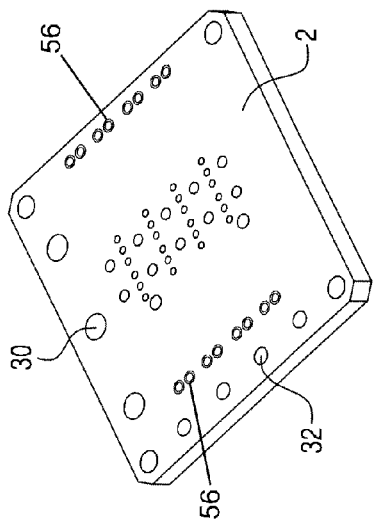
Figure 4B:
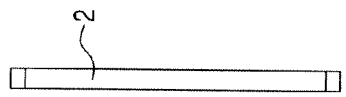
Figure 4A:
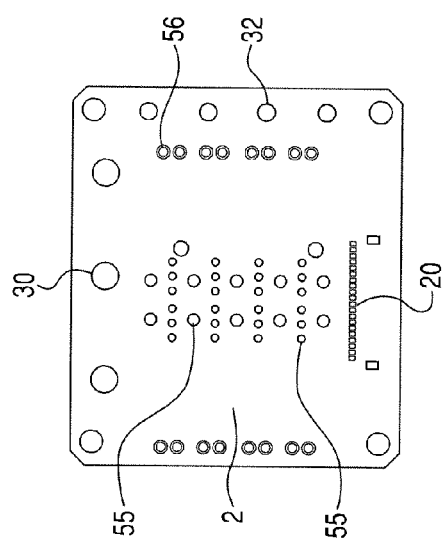
Figure 4D:
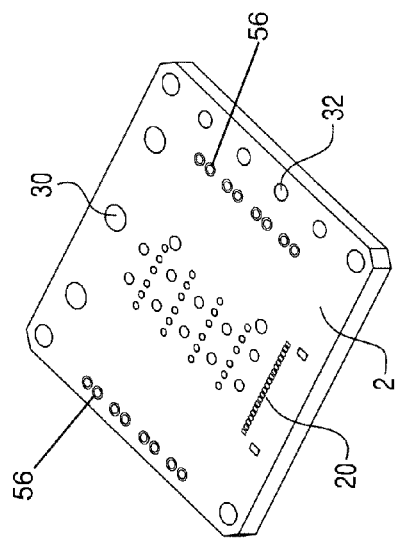

FIG. 2E illustrates a vacuum accumulator feature 40 associated with the third layer 3. The vacuum accumulator 40, which is shown as a U-shaped chamber within the third layer 3, can enhance vacuum response times for fast pick-and-place operations. In order to prevent any sag that may be caused by laminating the second layer 2 on top of the third layer 3, the U-shaped vacuum accumulator 40 of FIG. 2E also comprises waffle pattern features 45. It should be noted that the U-shaped vacuum accumulator 40 and the waffle pattern features 45 in FIG. 2E are illustrated for exemplary purposes. Therefore, according to the disclosed embodiment, vacuum accumulators 40 and/or sag-prevention features 45 of different shape, size or volume can be readily incorporated into one or more printed circuit board layers. FIG. 2E further illustrates internal ports and channels 50 within the third layer 3 that may be connected to inlet/outlet ports 30, 32 and/or ports and channels 50 in other layers.

FIG. 3 depicts top (FIG. 3A), bottom (FIG. 3C) and side (FIG. 3B) views of the first layer 1 of the multi-layer printed circuit board assembly of FIG. 1 that comprise a variety of orifices and thru holes 55. As noted earlier, flow restriction/control may be effected at least in-part through the features of the first layer 1. For example, to increase the flow of air and/or fluids, some or all of the orifices 55 that appear in the first layer 1 may be enlarged. For example, the enlargement can occur through drilling larger holes 55 (e.g., connecting several existing holes) at the final lamination stage. FIGS. 3D and 3E are top and bottom perspective views of the first layer 1.

FIG. 4 provides top (FIG. 4A), bottom (FIG. 4C) and side (FIG. 4B) views of the second layer 2 of the multi-layer printed circuit board assembly. As noted earlier, the electrical circuitry 20 located on top surface of the second layer 2 may provide various electrical signals for the multi-layer printed circuit board assembly 15. The second layer 2 may also comprise various orifices, through holes 55 and receptacles 56 for connecting off-the-shelf components 60, 62, 64 and/or providing air/fluid channels 50, ports and inlets/outlets 30, 32. While the exemplary second layer 2 of FIG. 4 is not depicted as comprising internal air/fluid channels 50, it should be understood that such channels may be in contact with, or exist within, at least one surface of the second layer 2. FIG. 4D is a top perspective view of the second layer 2. FIG. 4E is a bottom perspective view of the second layer 2.

FIG. 5 provides top (FIG. 5A), bottom (FIG. 5E) and side (FIG. 5D) views of the third layer 3 of the multi-layer printed circuit board assembly 15. The vacuum accumulator 40 with the associated waffle shaped features 45, as well as the internal channels 50 that may be connected to inlets/outlets 30, 32, are depicted in FIG. 5C. FIG. 5B is a side cross-sectional view of the third layer 3 along the section indicated in FIG. 5A. FIG. 5C is an inset of the indicated portion of FIG. 5B, showing a cross-sectional view of the waffle shaped features 45. FIGS. 5F and 5G are top and bottom perspective views of the third layer 3.

FIG. 6 illustrates top (FIG. 6A), bottom (FIG. 6E) and side (FIG. 6D) views of the fourth layer 4 of the multi-layer printed circuit board assembly 15. The internal ports and channels 50 within the fourth layer 4 are clearly visible in FIG. 6C. The internal ports and channels 50 associated with the fourth layer 4, as well as other ports and features associated with the other layers 1, 2, 3, can be incorporated into the printed circuit board layers 1, 2, 3, 4 during the fabrication of the printed circuit boards. For example, such features may be programmed by the vendor according to a drawing exchange format (DXF) file or another appropriate file or instructions. Sensor holes 57 are clearly visible in FIG. 6E. FIG. 6B is a side cross-sectional view of the fourth layer 4 along the section indicated in FIG. 6A. FIG. 6C is an inset of the indicated portion of FIG. 6B, showing a cross-sectional view of the internal ports and channels 50. FIGS. 6F and 6G are top and bottom perspective views of the fourth layer 4

Figure 8B:
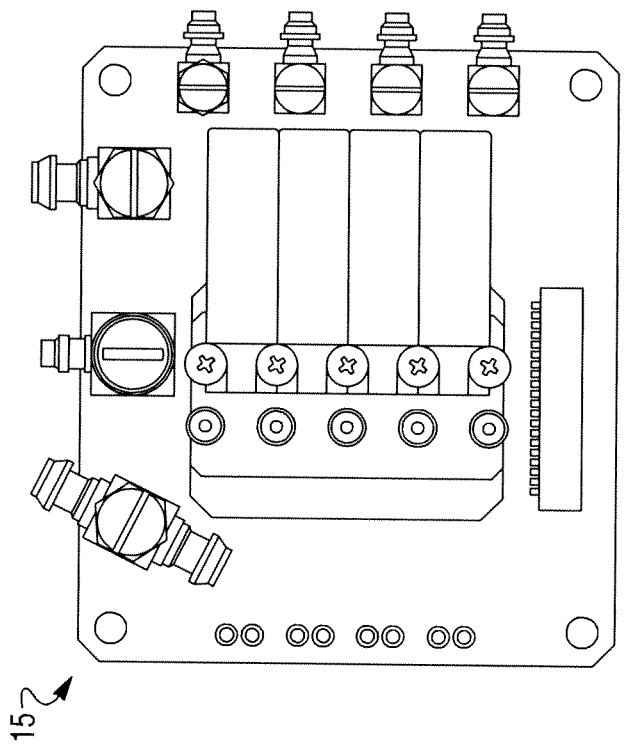
FIGS. 8A to 8B illustrate a device in accordance with an example embodiment of the present invention.
Figure 7B:
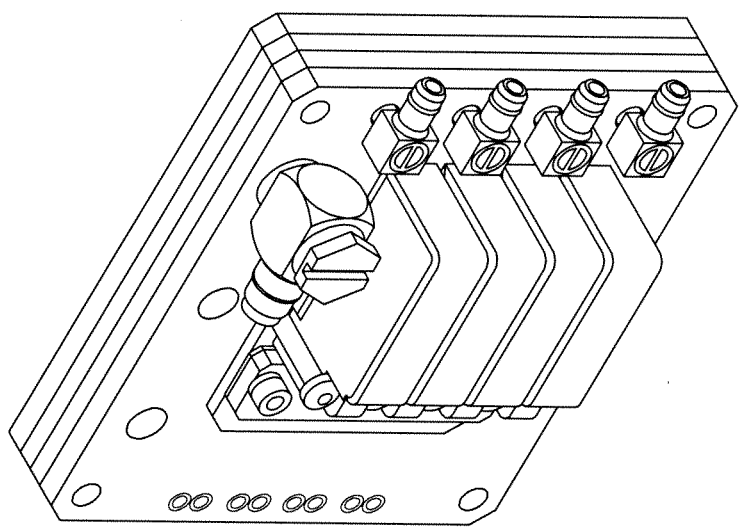
Figure 8A:
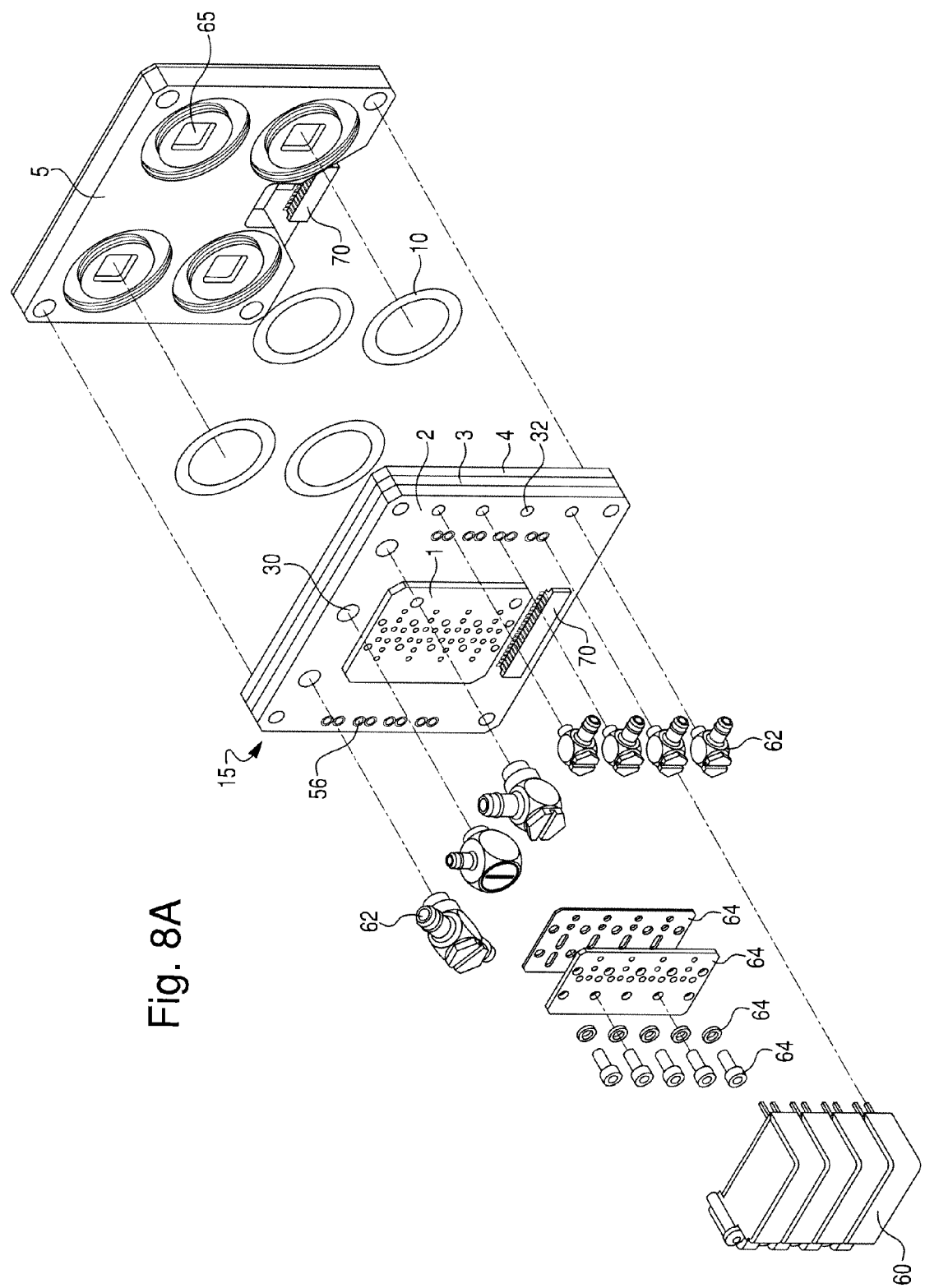
Figure 9B:
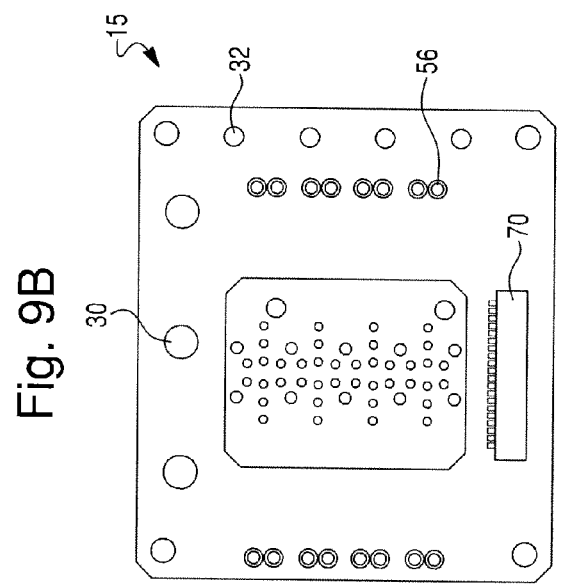
FIGS. 9A to 9E illustrate a multi-layer printed circuit board assembly in accordance with an example embodiment of the present invention.
Figure 9E:
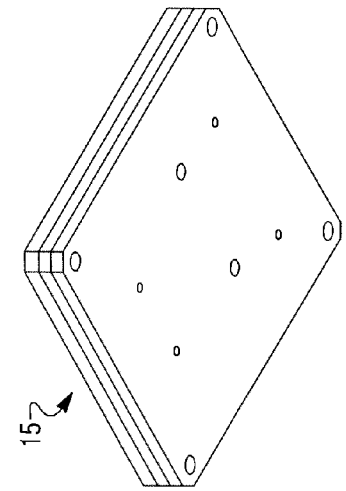
Figure 9A:
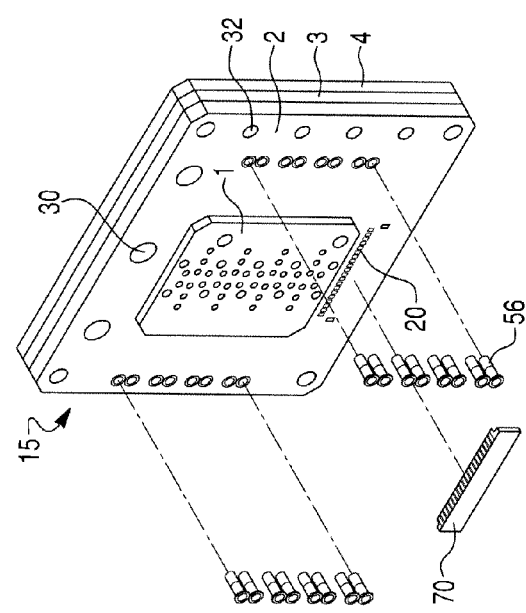
Figure 9D:
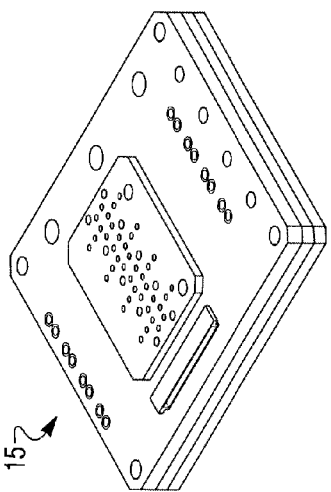
Figure 9C:
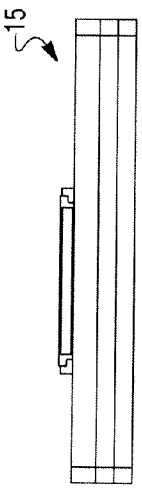

FIG. 7 illustrates a device produced in accordance with an embodiment of the present invention. The device comprises a blanking plate 5, which may be configured to accommodate a plurality of o-rings 10. One of the functions of the blanking plate 5 and the o-rings 10 is to act as a seal for the device to prevent the escape of air or fluids and to help in maintaining the proper vacuum. The blanking plate may further comprise various sensors, such as vacuum, pressure, flow and temperature sensors. A multi-layer printed circuit board assembly 15 is situated on top of the blanking plate 5. The 4-layer printed circuit board assembly comprises three layers 2, 3, 4 with substantially similar dimensions in addition to a smaller top layer 1. A connector 70 can be used to provide various signals, such as power, control and the like. The multi-layer printed circuit board 15 also includes receptacles 56 that can accommodate off-the-shelf components 60, 62, 64, such as pneumatic valves 60. Similarly, inlet and/or outlet ports 30, 32 can accommodate off-the-shelf fittings 60, 62, 64. FIG. 7 shows a number of off-the-shelf components 60, 62, 64 that can be plugged into the corresponding holes 55, ports 30, 32 and receptacles 56 on the second layer 2 of the multi-layer printed circuit board assembly 15. FIG. 7 also illustrates a blanking plate 5 and o-rings 10 that connect to the bottom surface of the fourth layer 4 of the multi-layer printed circuit board assembly 15. The assembled device is depicted in FIG. 7B. FIG. 8 illustrates another example device with similar features as FIG. 7. However, the device that is depicted in FIG. 8 also includes a blanking plate 5 that incorporates a plurality of sensors 65 and the associated electrical connectors 70.

FIG. 9 illustrates an exemplary embodiment of the multi-layer printed circuit board assembly 15 with electrical connections 20 on the second layer 2 that accommodates a connector 70 and a plurality of receptacles 56. FIG. 9A is a top exploded perspective view of the circuit board assembly 15. FIG. 9B is a top view of the circuit board assembly 15. FIG. 9C is a side view of the circuit board assembly 15. FIGS. 9D and 9E are top and bottom perspective views of the circuit board assembly 15.

Figure 10A:
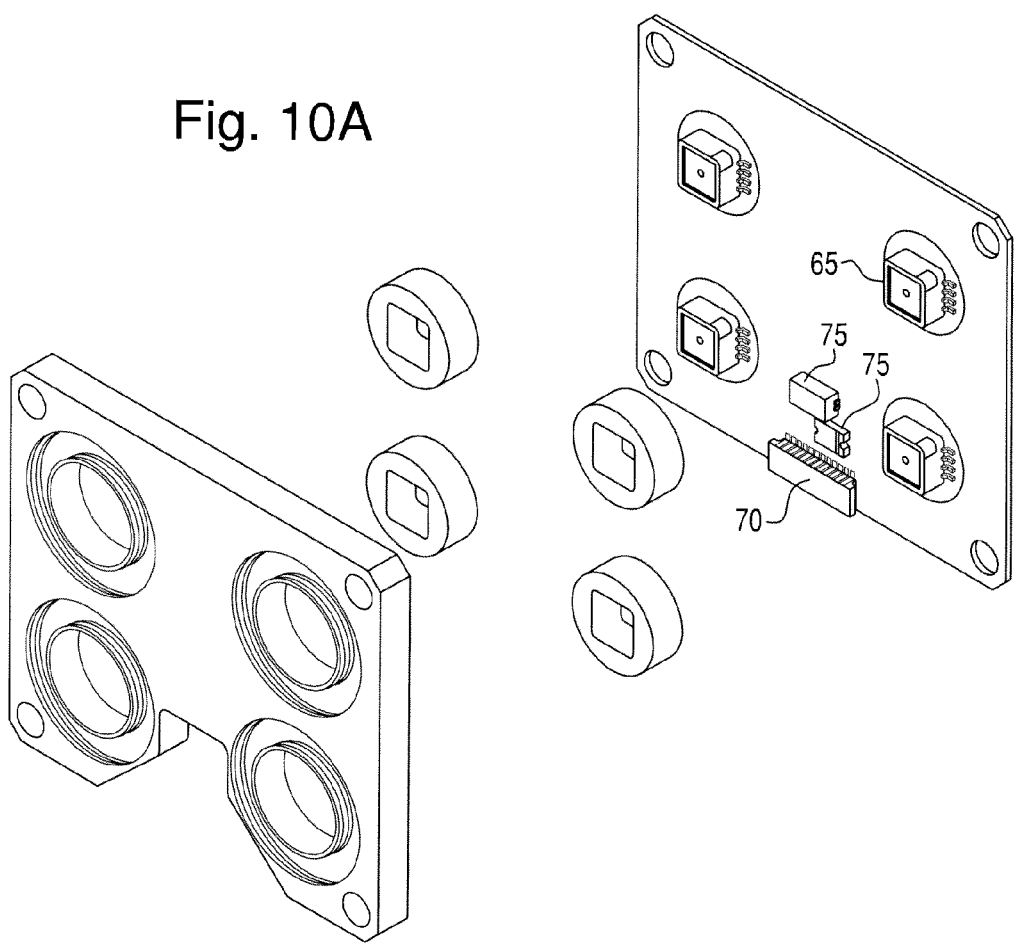
FIGS. 10A to 10B illustrate a blanking plate and associated components in accordance with an example embodiment of the present invention.
Figure 10B:
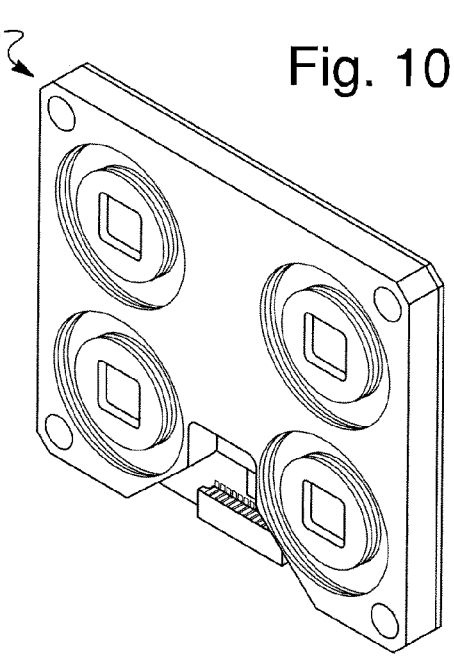

FIG. 10 shows an exemplary blanking plate 5 that includes four incorporated sensors 65. FIG. 10 also illustrates the electrical connectors 70 and/or additional electrical components 75 that may be necessary for proper operation of the sensors 65. While the blanking plate 5 may be fabricated from any suitable material, it may simply be another printed circuit board. The sensors 65 that are shown in FIG. 10 may be in contact with the air/fluid that resides or circulates through the multi-layer printed circuit board assembly 15. Such contact may be established through sensor holes 57 that reside within the fourth layer 4 of the multi-layer printed circuit board assembly 15. These sensor holes 57 can be observed in the bottom view of the fourth layer 4 in FIG. 6E. FIG. 10A is a top exploded perspective view of the blanking plate 10. FIG. 10B is a top perspective view of the assembled blanking plate 10.

As noted in connection with FIG. 2, in one embodiment, an internal vacuum accumulator 40 is milled into one of the internal layers. Such an internal vacuum accumulator 40 enhances vacuum response time for fast pick-and-place operations. As also noted in connection with FIGS. 7, 8 and 10, in one embodiment, a separate vacuum sensor printed circuit assembly (PCA) option may be added by simply augmenting the blanking plate that plugs the paralleled pneumatic signals. It should be noted that the sensor adapter configuration that is connected to the bottom layer of the multi-layer printed circuit board assembly may be implemented as an additional component to the blanking plate 5. Alternatively, the blanking plate 5 may be replaced with an adapter board, extension board, enhancement board and the like, that comprises the sensors 65, the associated circuitry and other components, and at the same time acting as a blanking plate 5 that prevents the escape of air or fluids. In another embodiment, one or more sensors 65 are integrated directly onto the PCB assembly in the form of, for example, surface mount or bare die devices. Such sensors may be, for example, vacuum, pressure, flow or temperature sensors that directly monitor the vacuum, pressure, flow and temperature associated with the air or fluid. The electrical power and signal connections for these sensors can be incorporated into the multi-layer circuit board assembly through, for example, an existing connector 70 that is depicted in FIG. 7. By having integrated sensors 65 close to the holes 55, ports 30, 32, and internal channels 50 that are milled into the multiple layers 1, 2, 3, 4, the response time of the device is enhanced by eliminating tubing and fittings that would have been required to connect to an external sensor.

According to another embodiment, flow restrictors can be incorporated into, for example, the top layer of the multi-layer printed circuit board assembly. The flow restrictors in the top layer allow the supplier to easily configure the end product at final lamination by drilling smaller or larger orifices 35 in the top layer. This also reduces costs vs. using off-the-shelf inline restrictors. Pneumatic valves 60 associated with the devices that are disclosed herein are easily field swappable since they may be fastened to the multi-layer printed circuit board assembly 15 via screws. Further, electrical connections can be established by directly plugging the valves 60 (with male pins) into the printed circuit assembly pin receptacles 56.

Figure 11B:
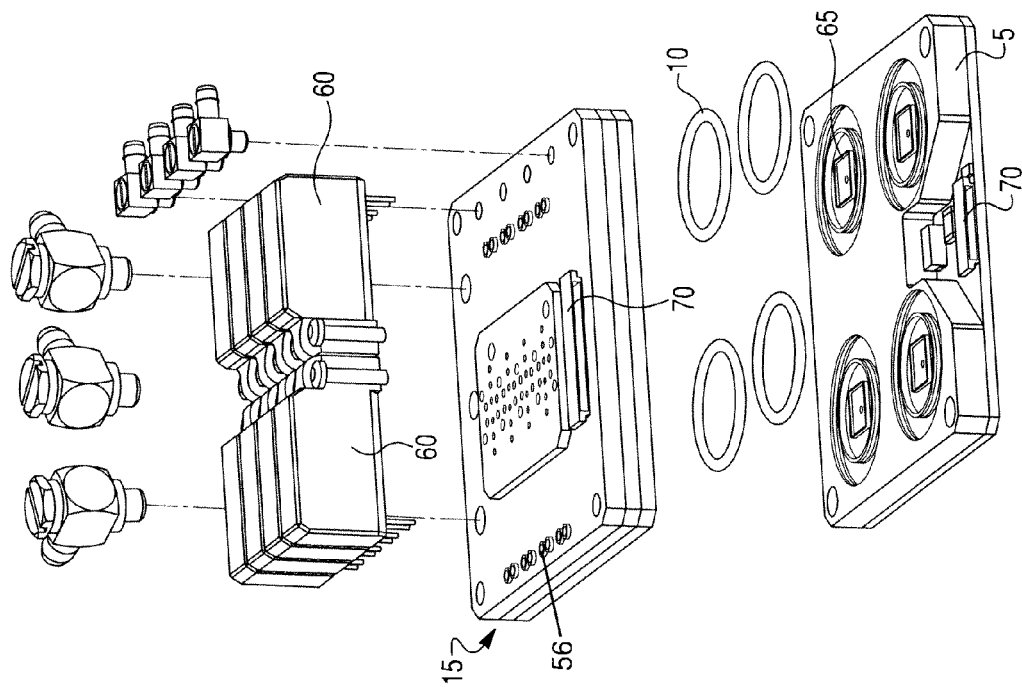
FIGS. 11A to 11B illustrate a blanking plate and associated components in accordance with an example embodiment of the present invention.
Figure 11A:
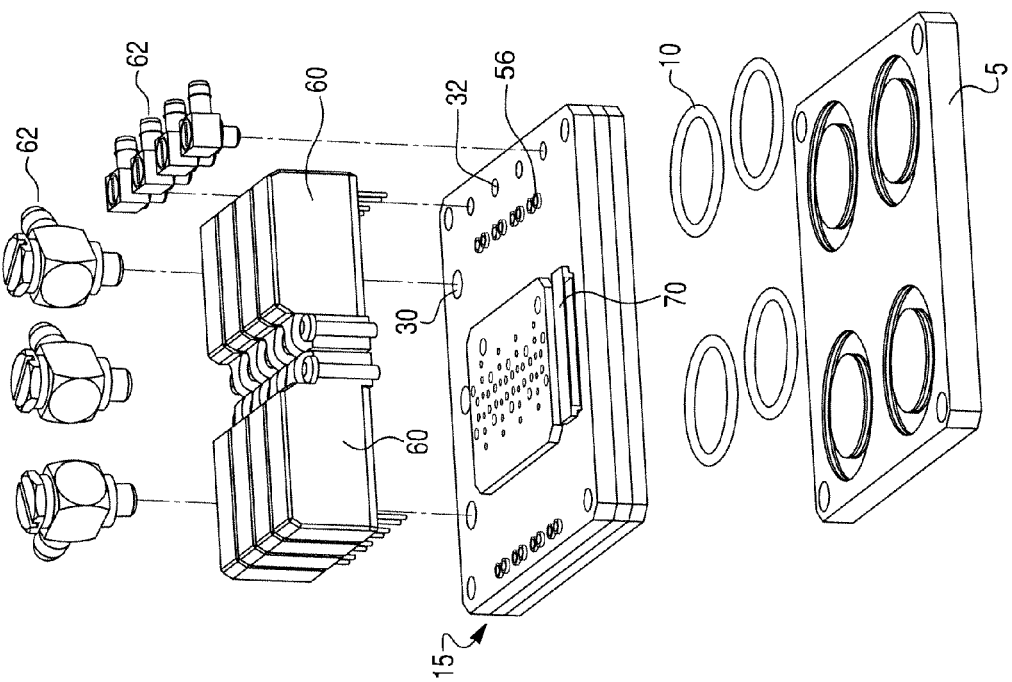
Figure 12B:
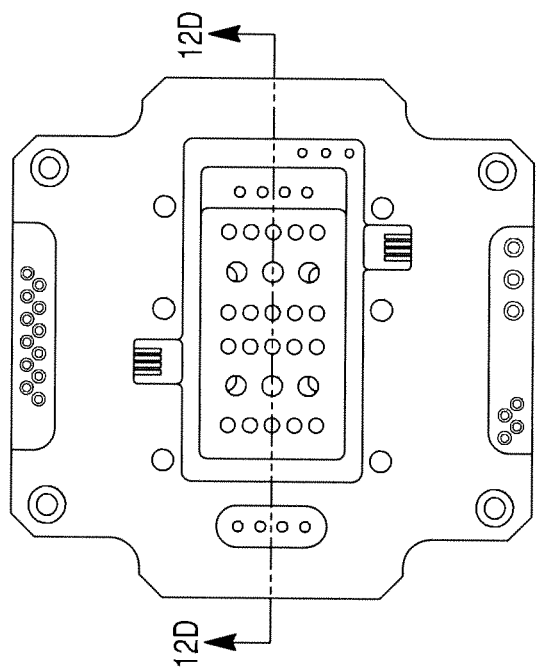
FIGS. 12A to 12F illustrate a device in accordance with an example embodiment of the present invention.
Figure 12A:
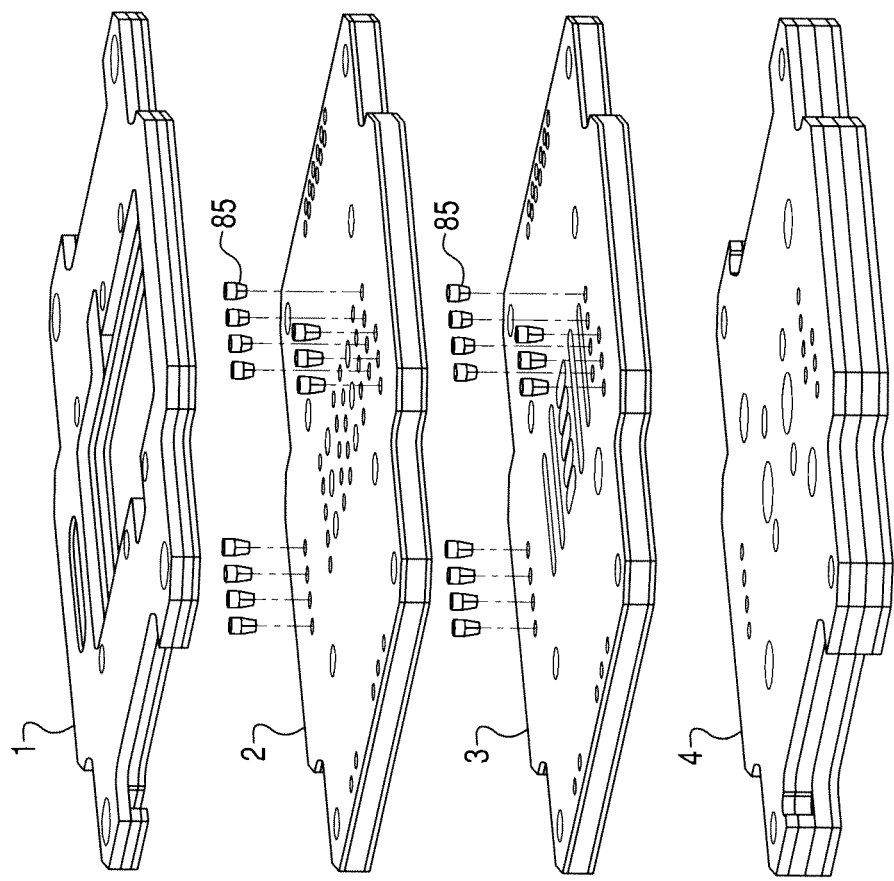
Figure 12C:
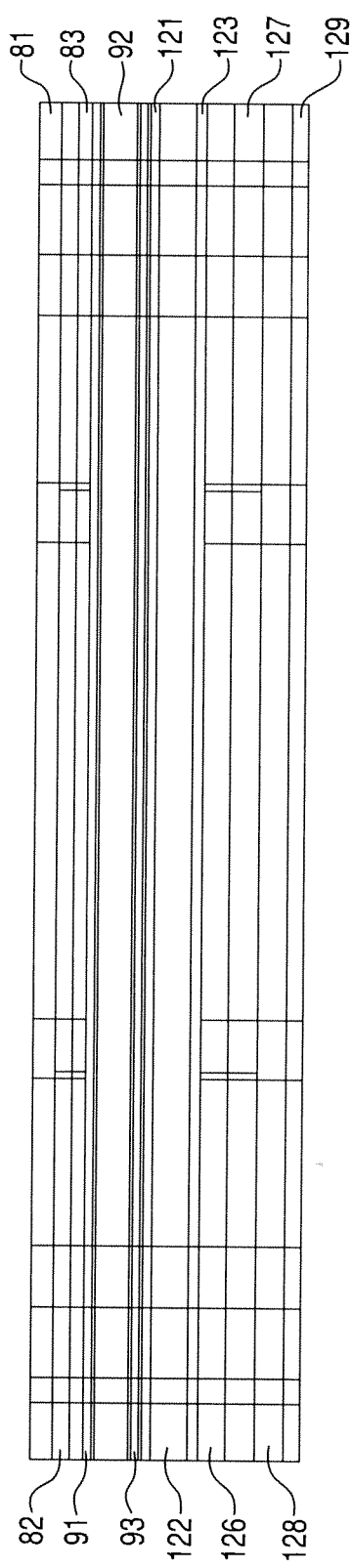
Figure 12D:
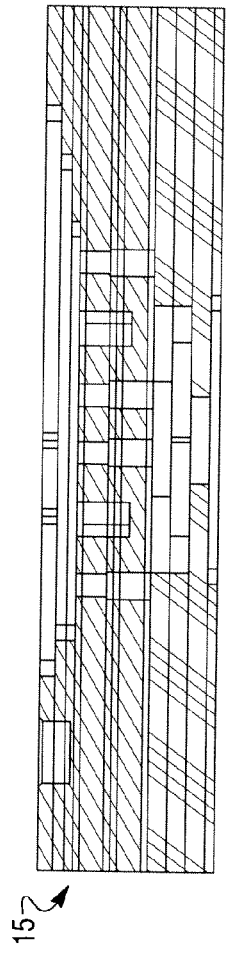
Figure 12F:
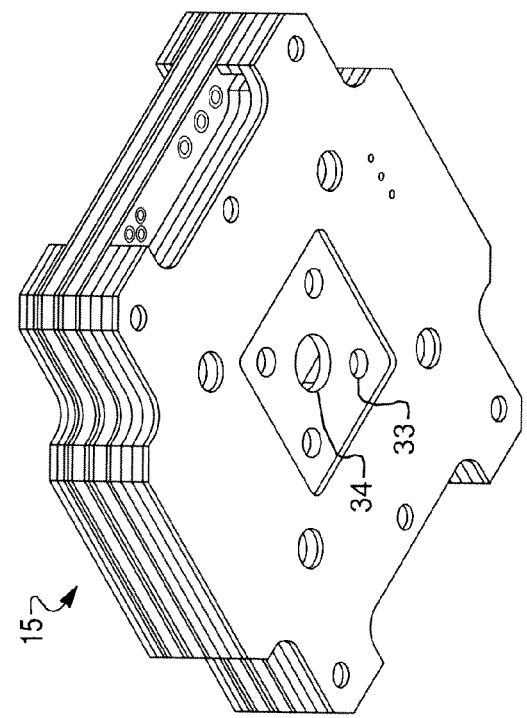
Figure 12E:
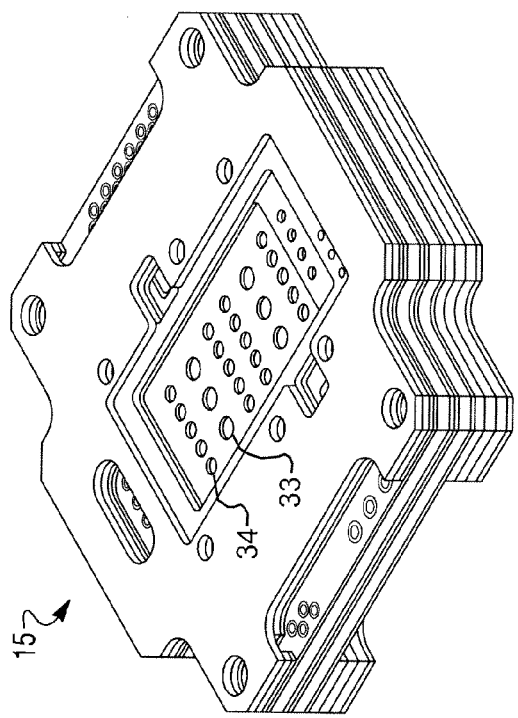
Figure 14A:
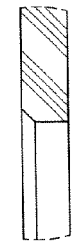
FIGS. 14A to 14G illustrate a sub-layer associated with the layer of FIG. 13 in accordance with an example embodiment of the present invention.
Figure 14B:
Figure 14C:
Figure 14D:
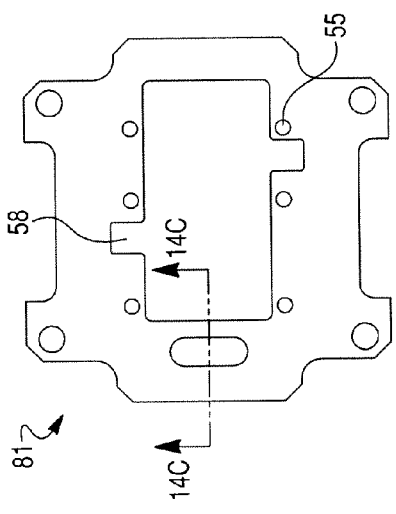
Figure 14E:
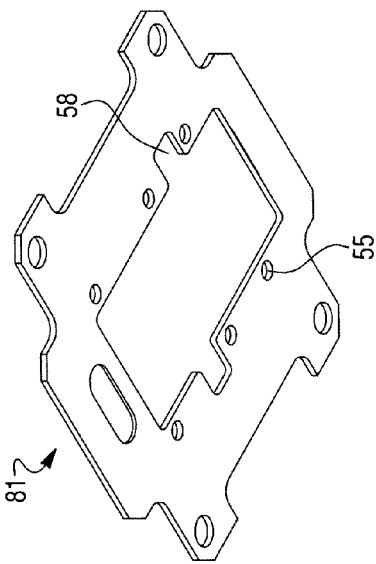
Figure 14F:
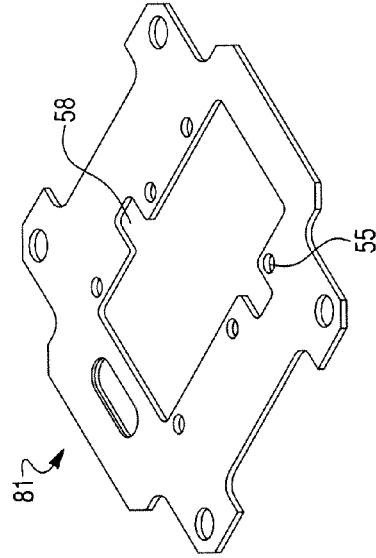
Figure 14G:
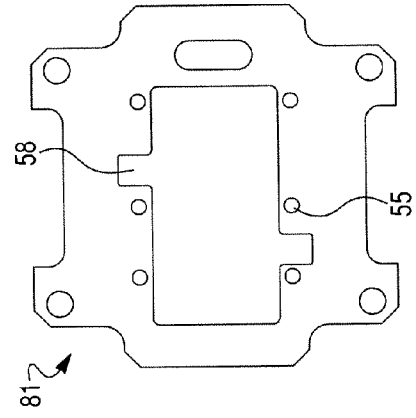
Figure 15C:
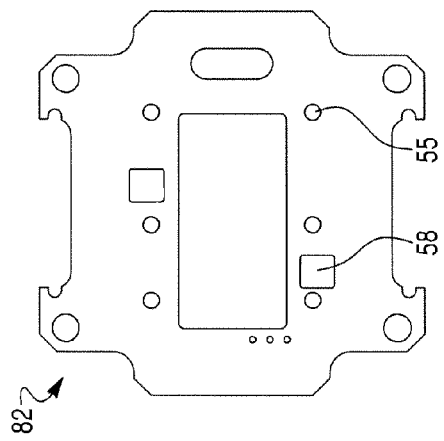
FIGS. 15A to 15E illustrate a sub-layer associated with the layer of FIG. 13 in accordance with an example embodiment of the present invention.
Figure 15B:
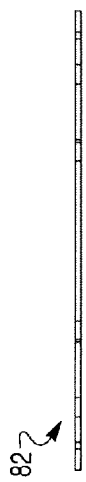
Figure 15A:
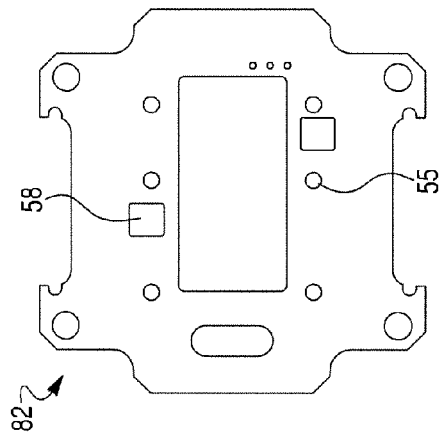
Figure 15E:
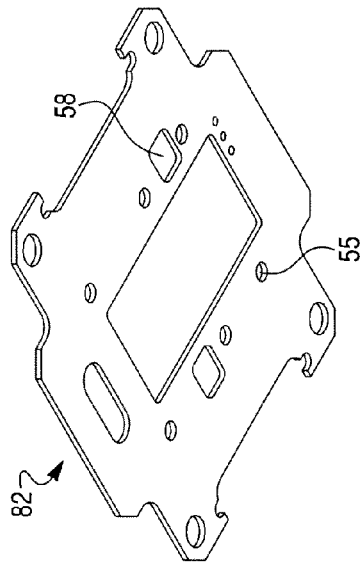
Figure 15D:
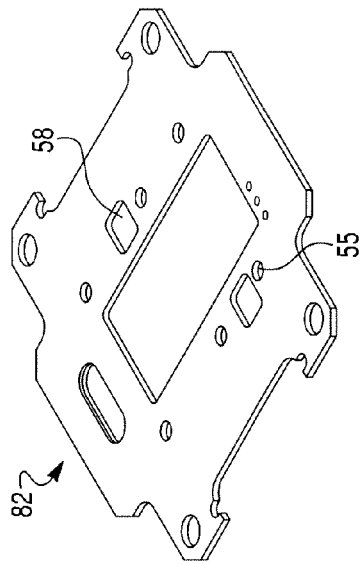
Figure 16C:
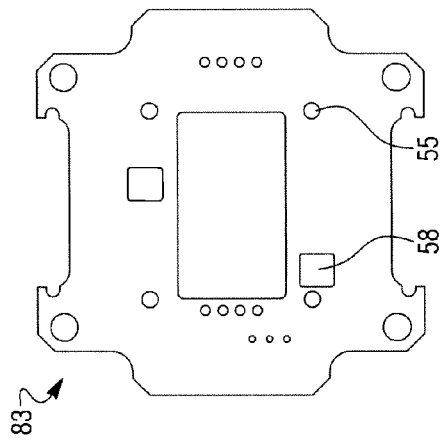
FIGS. 16A to 16E illustrate a sub-layer associated with the layer of FIG. 13 in accordance with an example embodiment of the present invention.
Figure 16B:
Figure 16A:
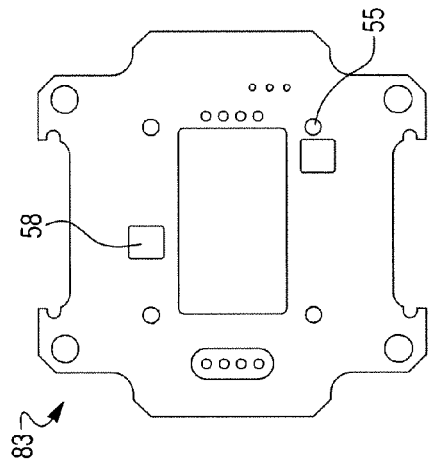
Figure 16E:
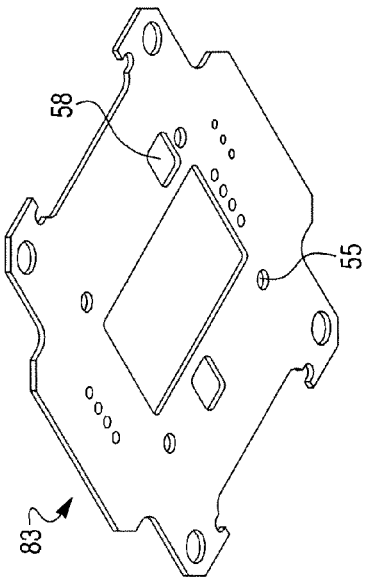
Figure 16D:
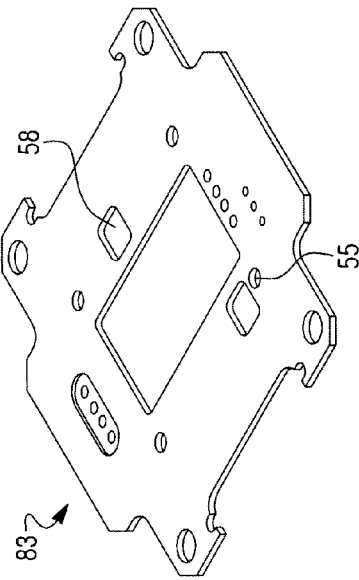
Figure 17C:
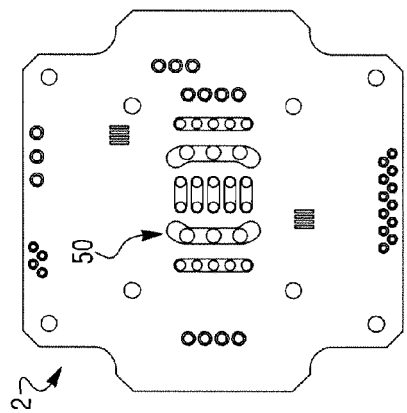
FIGS. 17A to 17E illustrate a layer associated with the device of FIG. 12 in accordance with an example embodiment of the present invention.
Figure 17B:
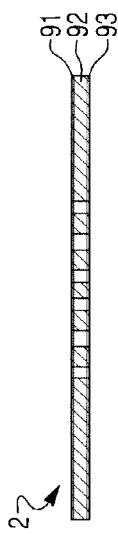
Figure 17E:
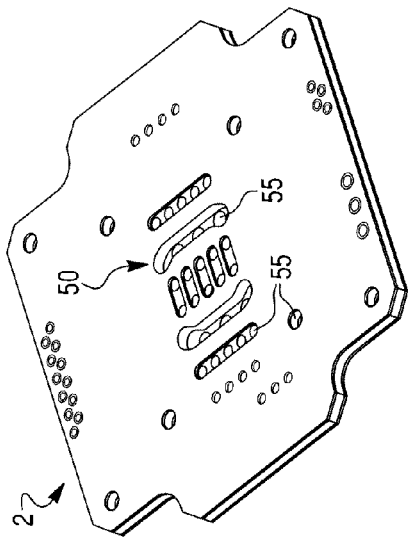
Figure 17A:
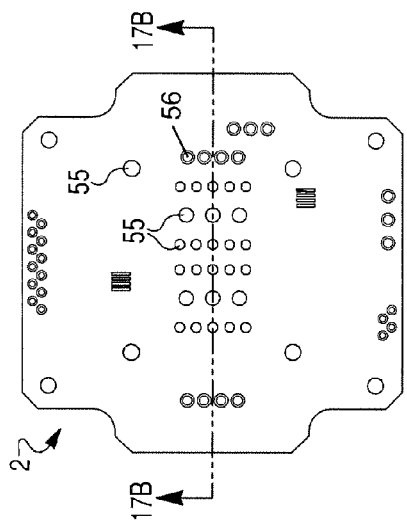
Figure 17D:
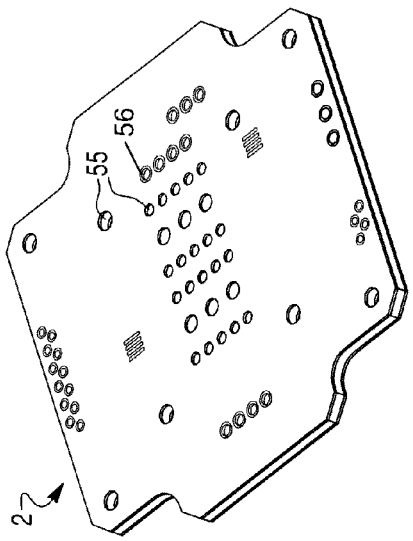

FIG. 11 illustrates the various components associated with two devices in accordance with example embodiments of the present invention. FIGS. 11A and 11B illustrate off-the-shelf valves 60 and fittings 62 that may be plugged into the receptacles 56 and input/output ports 30, 32 of the multi-layer printed circuit board assembly 15. The two devices that are shown in FIGS. 11A and 11B are similar to each other, except for the additional sensors 65 that are incorporated into the blanking plate 5 of the device in FIG. 11B.

The disclosed embodiments can also be applied to other applications that relate to integrating non-pneumatic fluid routing directly with electrical printed circuit boards. For example, the disclosed methods and devices can be used to integrate Hydrofluoroether (HFE) heat transfer fluid routing using the above-described devices that are produced in accordance with the disclosed techniques. This allows the integration of sensor and power lines in the fluid manifold.

FIGS. 12 to 25 illustrate the various components associated with an exemplary multi-layer printed circuit board assembly 15 with integrated channels 50, ports 30, 32 and electrical circuitry 20 in accordance with the various disclosed embodiments. The assembly that is depicted in FIGS. 12-25 may be specially suited for handling fluids and hydraulic components. Exemplary dimensions (stated in inches and/or metric units) associated with the features of various layers and sub-layers depicted in FIGS. 12-25 are discussed below. While these dimensions are associated with the illustrated exemplary embodiments, it is understood that features with other sizes or dimensions may be additionally, or alternatively, produced in accordance with the disclosed embodiments.

FIG. 12 illustrates top (FIGS. 12B and 12E), bottom (FIG. 12F) and side (FIG. 12C) views of an exemplary 4-layer printed circuit board assembly 15. FIG. 12A depicts a top perspective exploded view of the circuit board assembly 15, showing the staking order of individual layers, as well as sub-layers within each individual layer. FIG. 12A also illustrates contacts 85 that may be pressed into the second layer 2 and third layer 3 prior to laminating the layers 1, 2, 3, 4. FIG. 12B depicts a top view of the circuit board assembly 15. FIG. 12C depicts a side view of the circuit board assembly, which shows 13 individual sub-layers 81, 82, 83, 91, 92, 93, 121, 122, 123, 126, 127, 128, 129 that make up the final assembly. FIG. 12D depicts a side cross-sectional view of the circuit board assembly 15 at the section indicated in FIG. 12B. FIGS. 12E and 12F show various coolant inlet ports 33 and coolant outlet ports 34. The coolant inlet ports 33 allow a flow of new (cold) coolant. The coolant outlet ports 34 allow a flow of used (heated) coolant. The flow of coolant may be reversed, in which case the coolant inlet ports 33 and coolant outlet ports 34 may be reversed. The total height of the circuit board assembly 15 can be, for example, between 11.44 and 11.70 mm.

FIG. 13 provides top (FIGS. 13A and 13E), bottom (FIGS. 13D and 13F) and side (FIG. 13C) views of the first layer 1 of the multi-layer printed circuit board assembly 15 of FIG. 12. As can be seen from FIG. 13C, the first layer 1 is comprised of three sub-layers 81, 82, 83. While FIG. 13 illustrates three sub-layers 81, 82, 83, it is understood that in accordance with the disclosed embodiments, the first layer 1, or any layer within the multi-layer printed circuit board assembly 15, can comprise any number of sub-layers. FIG. 13B depicts a cross-section of the first layer 1 at the section indicated in FIG. 13A. The details associated with the first sub layer 81 of the first layer 1 are illustrated in FIG. 14. This figure shows the various features such as thru holes 55, and cut-outs 58 that may exist within the first sub-layer 81 of the first layer 1. FIGS. 15 and 16 illustrate similar details that are associated with the second sub-layer 82 and third sub-layer 83 of the first layer 1, respectively. The sub-layers 81, 82, 83, when stacked on top of each other, and/or laminated, make up the first layer 1 of the multi-layer printed circuit board assembly 15. The height of the first layer 1 can be, for example, between 2.15 and 2.33 mm.

Figure 18B:
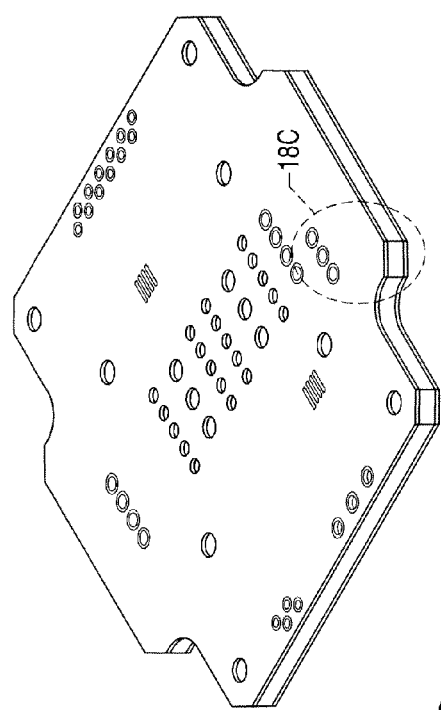
FIGS. 18A to 18C illustrate additional details associated with the layer of FIG. 17 in accordance with an example embodiment of the present invention.
Figure 18C:
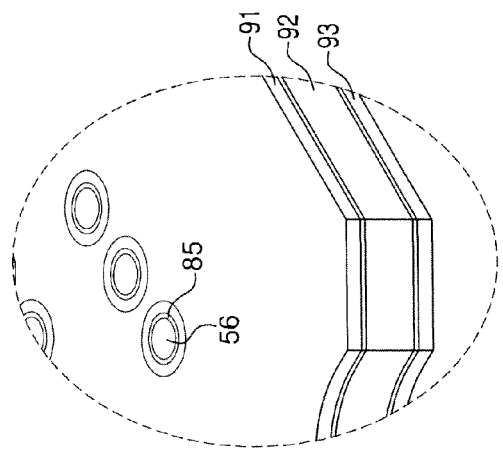
Figure 18A:
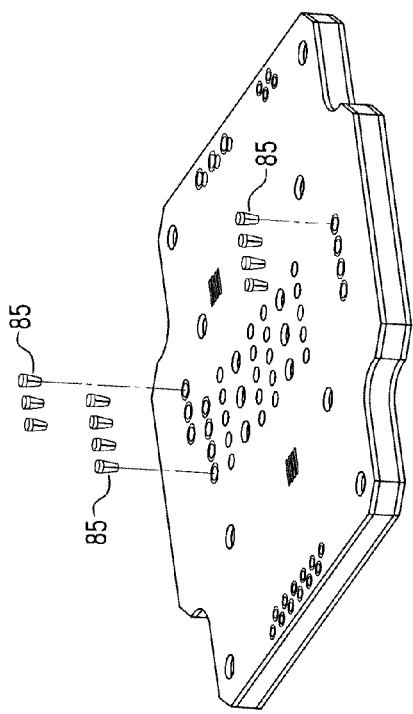
Figure 19C:
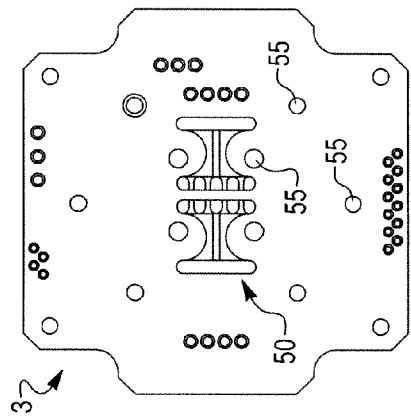
FIGS. 19A to 19E illustrate a layer associated with the device of FIG. 12 in accordance with an example embodiment of the present invention.
Figure 19B:
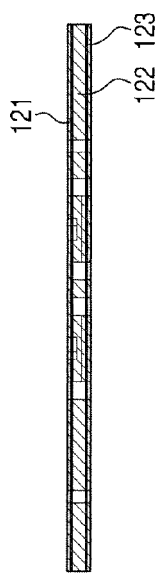
Figure 19E:
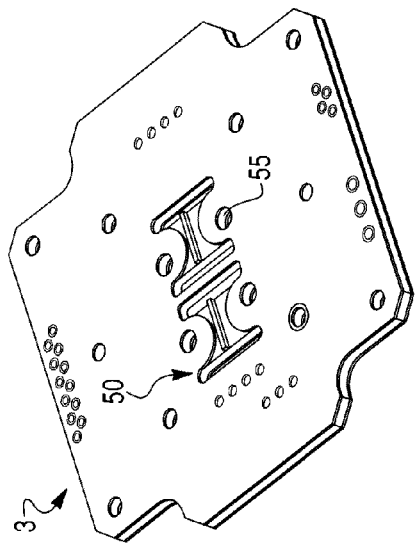
Figure 19A:
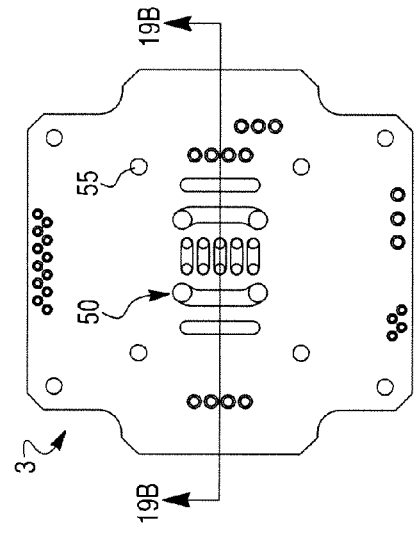
Figure 19D:
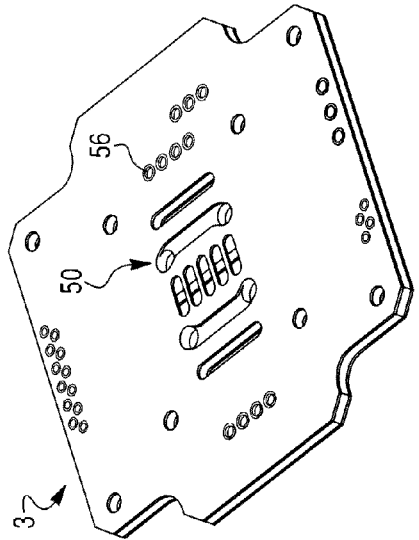

The details associated with the second layer 2 of the exemplary 4-layer printed circuit board assembly 15 are illustrated in FIG. 17. FIGS. 17A and 17D are top views of the second layer 2. FIGS. 17C and 17E are bottom views of the second layer 2. FIG. 17B is a side cross-sectional view of the second layer 2 at the section indicated in FIG. 17A. As evident from FIG. 17B, the second layer 2 comprises three sub-layers 91, 92, 93. The various views of layer 2 that are depicted in FIG. 17 illustrate the various thru holes 55, ports 30, 32, internal fluidic channels 50 and other features that may be integrated into the second layer 2. One of more of the sub-layers associated with the second layer 2 can comprise copper clad epoxy glass. For example, any of the sub-layers 91, 92, 93 may be comprised of FR-4 material. FIG. 17 illustrates that the top side of the second layer 2 may be used for gasket interface. The height of the second layer 2 can be, for example, between 2.32 and 2.52 mm. FIG. 18 is another diagram of the second layer 2 of the exemplary 4-layer printed circuit board assembly 15 that was illustrated in FIG. 12. FIG. 18A is a top exploded perspective view that shows certain assembly details associated with the second layer 2. FIG. 18C is an inset of the indicated portion of FIG. 18B. As illustrated in FIG. 18C, the contacts 85 that are illustrated in FIG. 18A may be press-fitted into the second layer 2 so that they are flush with the top surface of the second layer 2.

Figure 20B:
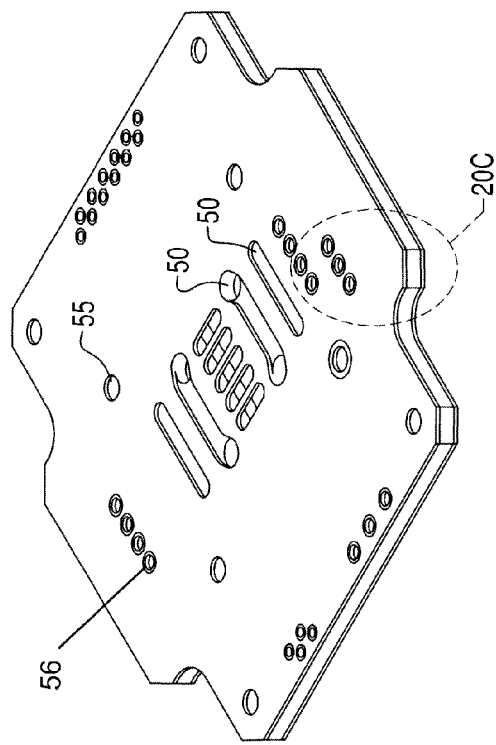
FIGS. 20A to 20C illustrate additional details associated with the layer of FIG. 19 in accordance with an example embodiment of the present invention.
Figure 20A:
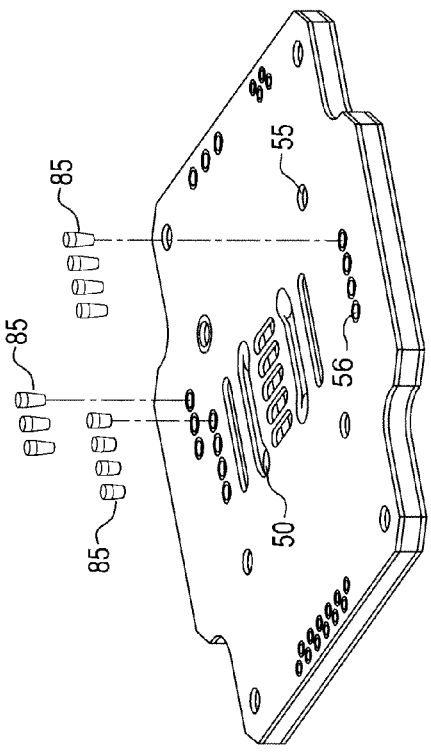
Figure 20C:
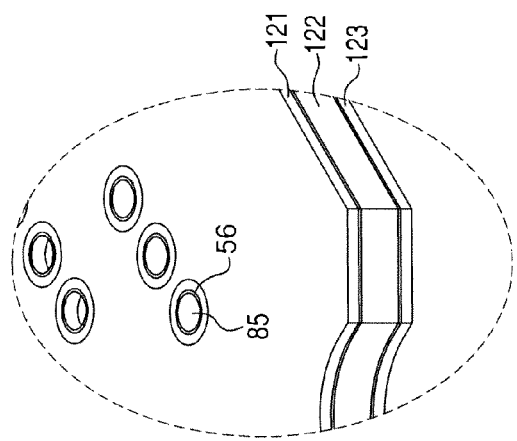
Figure 21C:
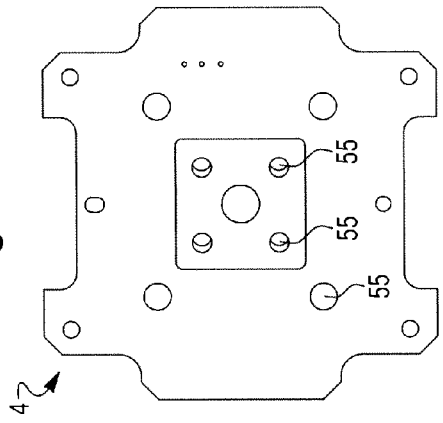
FIGS. 21A to 21E illustrate a layer associated with the device of FIG. 12 in accordance with an example embodiment of the present invention.
Figure 21B:
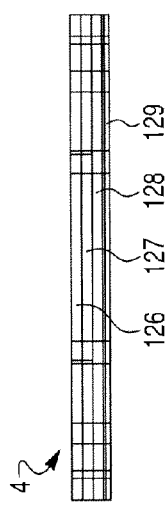
Figure 21A:
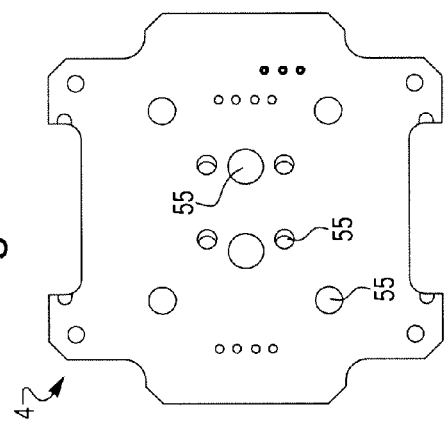
Figure 21E:
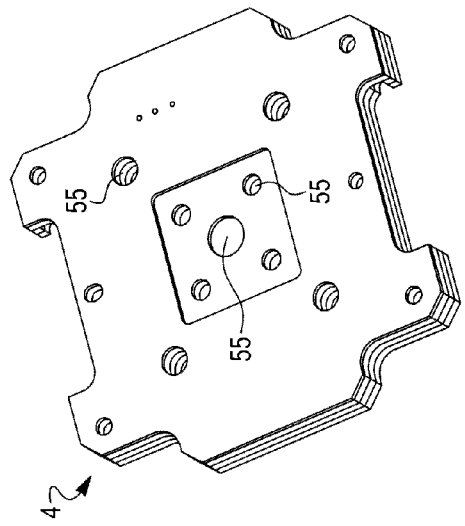
Figure 21D:
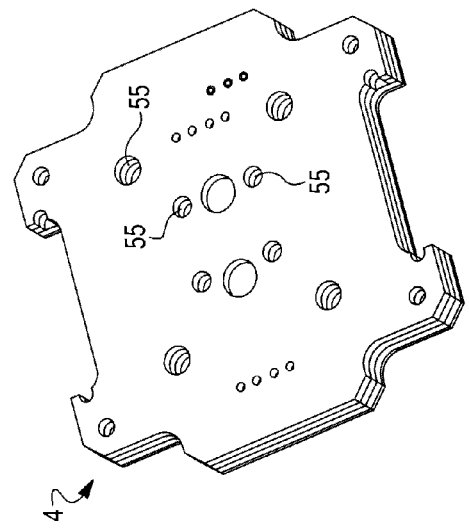
Figure 22C:
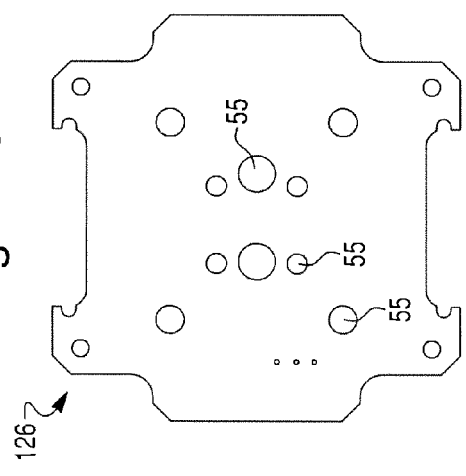
FIGS. 22A to 22E illustrate a sub-layer associated with the layer of FIG. 21 in accordance with an example embodiment of the present invention.
Figure 22B:
Figure 22E:
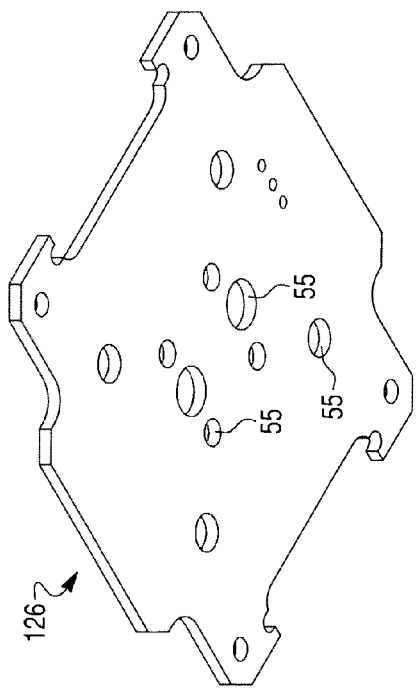
Figure 22A:
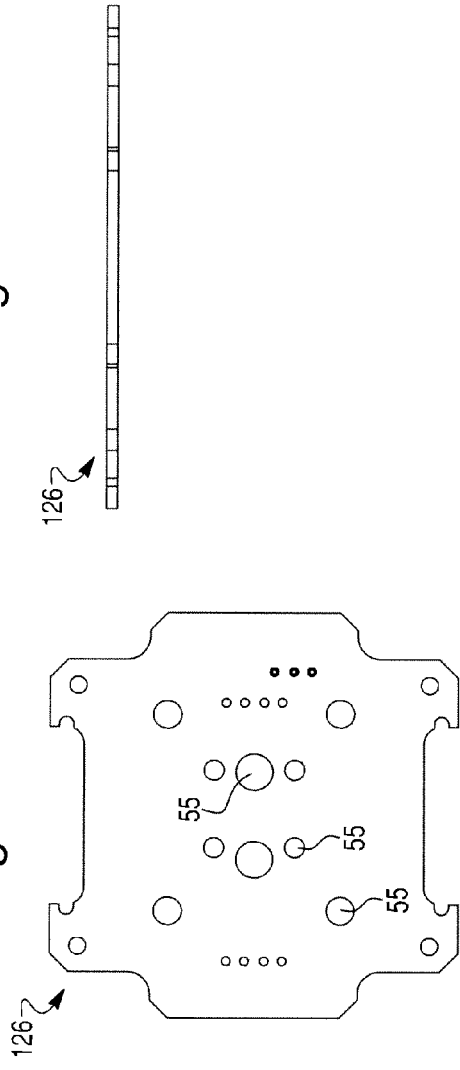
Figure 22D:
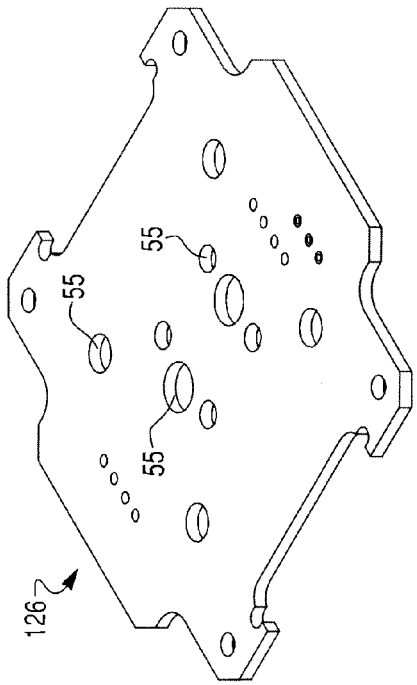
Figure 23C:
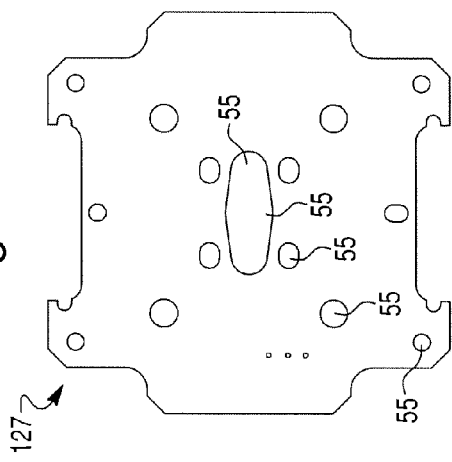
FIGS. 23A to 23E illustrate a sub-layer associated with the layer of FIG. 21 in accordance with an example embodiment of the present invention.
Figure 23B:
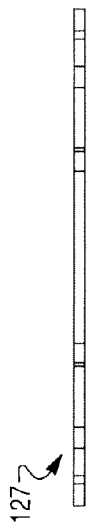
Figure 23A:
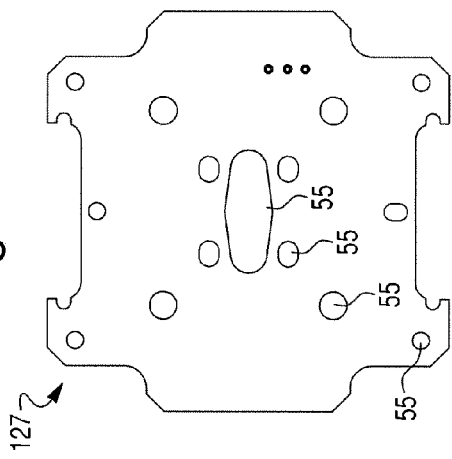
Figure 23E:
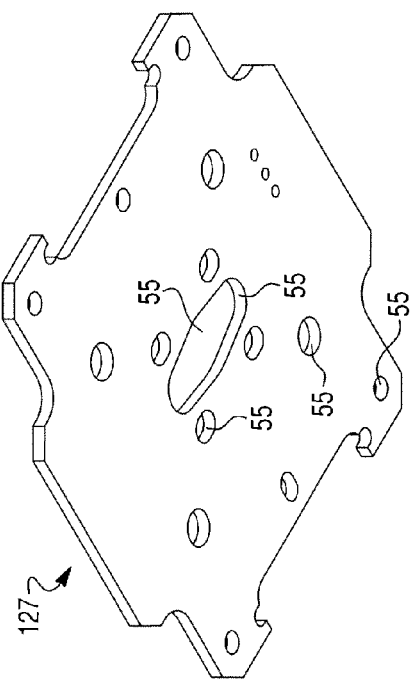
Figure 23D:
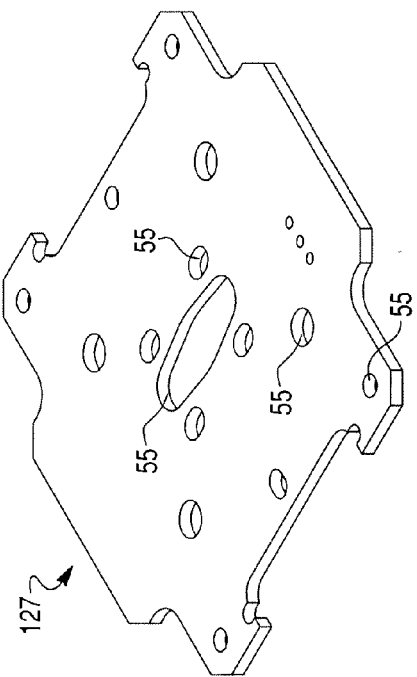
Figure 24C:
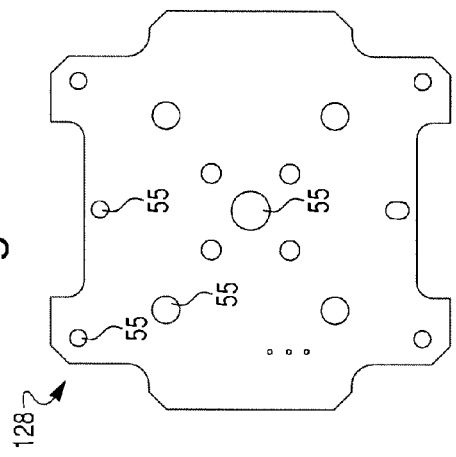
FIGS. 24A to 24E illustrate a sub-layer associated with the layer of FIG. 21 in accordance with an example embodiment of the present invention.
Figure 24B:
Figure 24E:
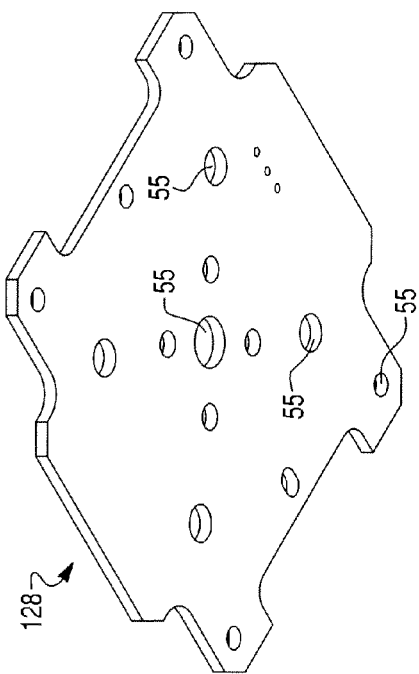
Figure 24A:
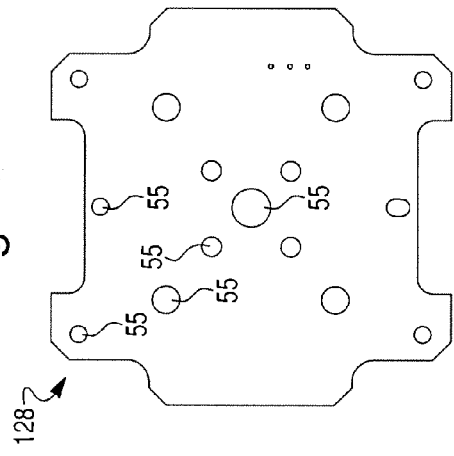
Figure 24D:
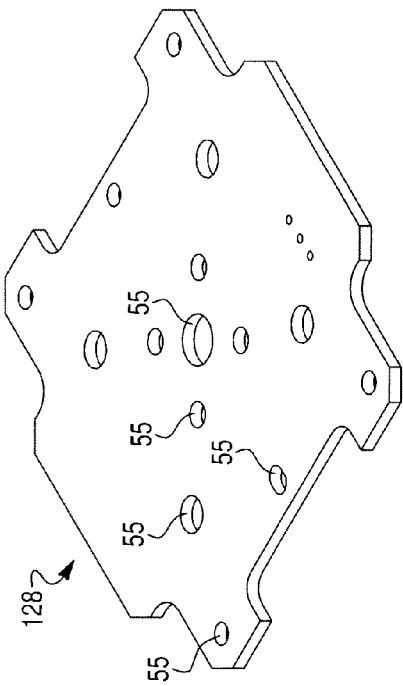
Figure 25C:
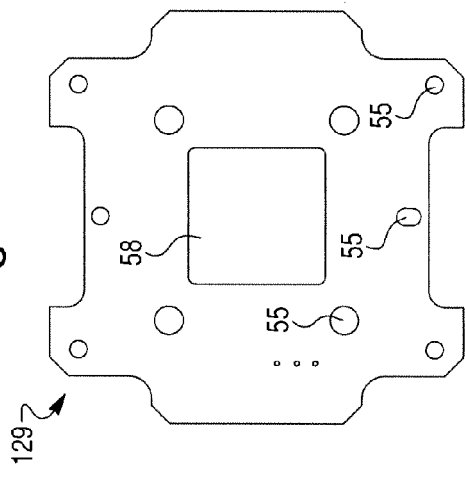
FIGS. 25A to 25E illustrate a sub-layer associated with the layer of FIG. 21 in accordance with an example embodiment of the present invention.
Figure 25B:
Figure 25A:
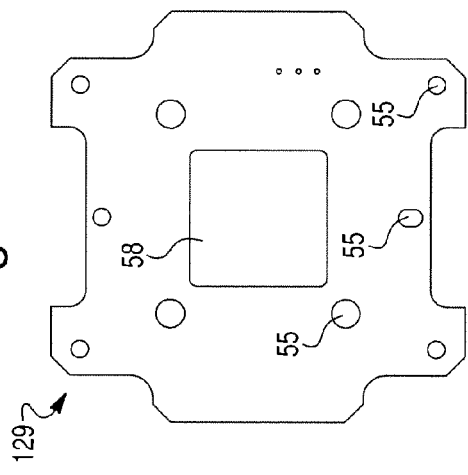
Figure 25E:
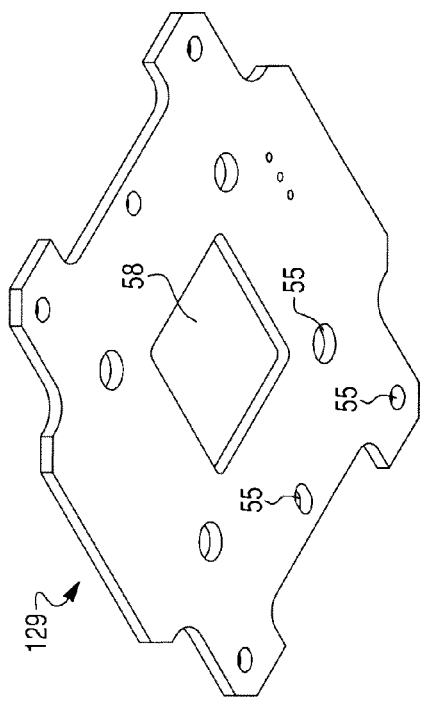
Figure 25D:
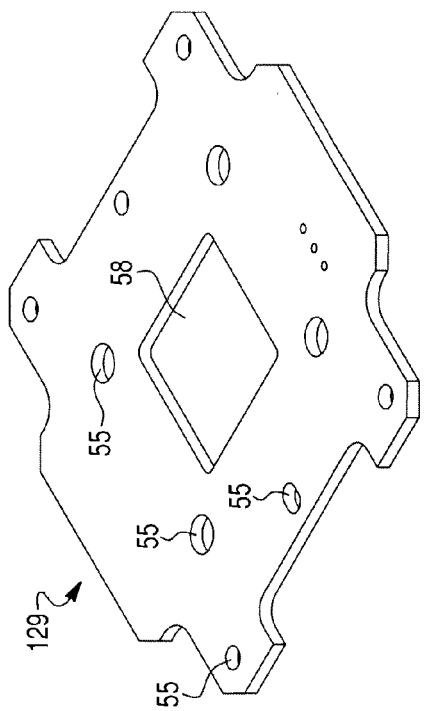

FIG. 19 includes top (FIGS. 19A and 19D) and bottom (FIGS. 19C and 19E) views of the third layer 3 of the exemplary 4-layer printed circuit board assembly 15 of FIG. 12. FIG. 19B is a side cross-sectional view of the third layer 3 at the section indicated in FIG. 19A. As evident from FIG. 19B, this layer comprises three sub-layers 121, 122, 123. The various views of the third layer 3 that are depicted in FIG. 19 illustrate thru holes 55, ports 30, 32, internal fluidic channels 50 and other features that may be integrated into the third layer 3 of the multi-layer printed circuit board assembly 15. FIG. 20 is another diagram of the third layer 3 of the exemplary 4-layer printed circuit board assembly 15 that was illustrated in FIG. 12. FIG. 20A is a top exploded perspective view that shows certain assembly details associated with the third layer 3. FIG. 20C is an inset of the indicated portion of FIG. 20B. As illustrated in FIG. 20C, the contacts 85 that are illustrated in FIG. 20A may be press-fitted into the third layer 3 so that they are flush with the top surface of the third layer 3.

FIG. 21 includes top (FIGS. 21A and 21D) and bottom (FIGS. 21C and 21E) views of the fourth layer 4 of the exemplary 4-layer printed circuit board assembly 15 of FIG. 12. FIG. 21B is a side view of the fourth layer 4. As evident from FIG. 21B, the fourth layer 4 comprises four sub-layers 126, 127, 128, 129, which when stacked on top of each other, and/or laminated, make up the fourth layer 4 of the multi-layer printed circuit board assembly. The height of the fourth layer 4 can be, for example, between 4.17 and 4.51 mm. The details associated the sub-layers 126, 127, 128, 129 are illustrated in FIGS. 22, 23, 24 and 25. These figures show the various thru holes 55, ports 30, 32, internal fluidic channels 50 and other features that may be integrated into the sub-layers associated with the fourth layer 4 of the exemplary 4-layer printed circuit board assembly 15.

Figure 26:
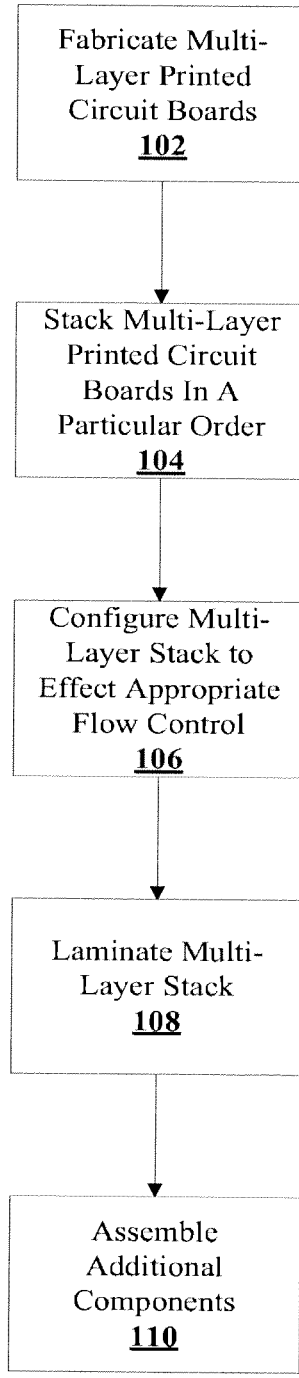
FIG. 26 is a flow chart illustrating a process in accordance with an example embodiment of the present invention.

FIG. 26 is a block diagram that illustrates the various steps associated with producing a device that comprises a multi-layer printed circuit board assembly with integrated output/input ports, internal air/fluid channels, as well as electrical connections and electronic components. In step 102, the individual layers or sub-layers associated with each layer of the multi-layer printed circuit board assembly are fabricated. This step can be carried out by, for example, providing the appropriate files or instructions to a printed circuit board fabrication facility. The files and/or instructions must have the necessary details for the circuit board manufacturer to fabricate the multiple layers with features that are associated with thru holes, internal channels, inlet/outlet ports, electrical connections and the like.

In step 104, the multiple layers and/or sub-layers are stacked on top of each other in a particular order. For example, as illustrated in FIGS. 2 and 7, the first layer 1 is stacked on top of the second layer 2; the second layer 2 is tacked on top of the third layer 3; the third layer 4 is stacked on top of the fourth layer 4, and so on. It should be noted that as part of fabrication of the multiple layers in step 102, the individual sub-layers within a layer may be bounded together to produce a single layer. Alternatively, some or all of the sub-layers may be provided individually and assembled in step 104 along with other sub-layers or layers. It should also be noted that prior to the stacking of multiple layers, certain components, such as receptacles, gaskets, press-type or other contact components, electrical connectors and electronic circuits and the like, may need to be incorporated into the individual layers.

In step 106, the multi-layer stack of printed circuit boards may be optionally configured to provide an appropriate flow restriction/control. For example, as noted earlier, the existing orifices on one of the multiple layers may be enlarged to modify the flow characteristics of air or fluid. It should be noted that while step 106 is shown as a separate step in order to facilitate the understanding of the disclosed embodiments, this step may be carried out simultaneously with the lamination step.

In step 108, the multi-layer stack is laminated to produce the multi-layer printed circuit board assembly with integrated ports, channels and electrical circuitry. The ports within the sub-layers may be connected via drilled holes in each layer that line up with the mating layers. To ensure proper alignment of the ports and internal channels, a plurality of registration holes may be used. To this end, all of the layers may be registered with pins and then bonded together as one piece. After lamination, all of the unique port connections are internally tied together. In one embodiment, a blanking plate may also be laminated along with the multi-layer printed circuit board assembly. For example, the blanking plate may be a printed circuit board. Additionally, the blanking plate may comprise one or more sensors, such as temperature, flow, pressure and vacuum sensors.

In step 110, a number of additional components may be connected to the multi-layer printed circuit board assembly.

For example, components, such as off-the-shelf valves and fittings, electrical connectors, electronic components and the like, may be connected to the multi-layer printed circuit board assembly. In one embodiment, a blanking plate may also be attached to the multi-layer printed circuit board assembly. The blanking plate may also comprise one or more sensors, such as temperature, flow, pressure and vacuum sensors.

In order to facilitate the understanding of the underlying concepts, the disclosed embodiments have been exemplarily described in the context of devices that are used for testing electronic components. However, it should be understood that the disclosed embodiments are readily applicable to other areas and applications that require an integration of pneumatic, hydraulic and electrical components. For example, the various disclosed embodiments can be used in automotive and/or medical device applications. Further, the various steps that are described throughout this application are considered exemplary, and it is understood that the steps may be performed in different order than what is described. In addition, fewer or additional steps may be included.

The foregoing description of embodiments has been presented for purposes of illustration and description. The foregoing description is not intended to be exhaustive or to limit embodiments of the present invention to the precise form disclosed, and modifications and variations are possible in light of the above teachings or may be acquired from practice of various embodiments. The embodiments discussed herein were chosen and described in order to explain the principles and the nature of various embodiments and its practical application to enable one skilled in the art to utilize the present invention in various embodiments and with various modifications as are suited to the particular use contemplated. The features of the embodiments described herein may be combined in all possible combinations of methods, apparatus, modules, systems, and computer program products.

What is claimed is:

1. A device, comprising:
   a plurality of layers, each successive layer, other than a bottom layer, being stacked on top of another layer to form a multi-layer printed circuit board assembly;
   one or more inlet or outlet ports integrated into the multi-layer printed circuit board assembly; and
   one or more air or fluid channels internal to the multi-layer printed circuit board assembly;
   wherein at least one layer of the plurality of layers includes an electrical circuitry integrated into said layer at a surface of said layer,
   wherein at least one layer of the plurality of layers includes an air or fluid channel that extends only partially through said layer in a thickness direction of said layer, and
   wherein the device further comprises:
   (i) a blanking plate connected to a bottom layer of the multi-layer printed circuit board assembly, or
   (ii) a sensor adaptor board connected to a bottom layer of the multi-layer printed circuit board assembly, the sensor adaptor board comprising one or more sensors.

2. The device of claim 1, wherein the multi-layer printed circuit board assembly is produced by laminating the plurality of printed circuit board layers that are stacked on top of each other.

3. The device of claim 1, wherein the device comprises the blanking plate connected to the bottom layer of the multi-layer printed circuit board assembly.

4. The device of claim 1, wherein the device comprises the sensor adapter board connected to the bottom layer of the multi-layer printed circuit board assembly.

5. The device of claim 4, wherein the one or more sensors are selected from a group of sensors consisting of: a temperature sensor, a vacuum sensor, a pressure sensor, and a flow sensor.

6. The device of claim 1, wherein one or more of the plurality of printed circuit boards comprises a fiber-filled plastic material.

7. The device of claim 1, further comprising a vacuum accumulator internal to the multi-layer printed circuit board assembly.

8. The device of claim 1, wherein a flow restriction mechanism is integrated into a layer of the multi-layer printed circuit board assembly.

9. The device of claim 1, wherein the multi-layer printed circuit board assembly is configured to accommodate off-the-shelf components.

10. The device of claim 9, wherein the off-the-shelf components are pneumatic components.

11. The device of claim 1, wherein the multi-layer printed circuit board assembly comprises receptacles configured to accommodate off-the-shelf components.

12. The device of claim 1, wherein the one or more inlet or outlet ports and the channels are configured to operate with non-pneumatic fluids.

13. The device of claim 1, further comprising one or more sensors integrated into the multi-layer printed circuit board assembly.

14. The device of claim 13, wherein the one or more sensors are selected from a group of sensors consisting of: a temperature sensor, a vacuum sensor, a pressure sensor, and a flow sensor.

15. A method, comprising:
   stacking a plurality of layers on top of each other;
   laminating the stacked layers to produce a multi-layer printed circuit board assembly comprising:
      one or more inlet or outlet ports integrated into the multi-layer printed circuit board assembly,
      one or more air or fluid channels internal to the multi-layer printed circuit board assembly,
      wherein at least one layer of the plurality of layers includes an electrical circuitry integrated into said layer at a surface of said layer, and
      wherein at least one layer of the plurality of layers includes an air or fluid channel that extends only partially through said layer in a thickness direction of said layer; and
   connecting, to a bottom layer of the multi-layer printed circuit board assembly:
      (i) a blanking plate, or
      (ii) a sensor adaptor board comprising one or more sensors.

16. The method of claim 15, further comprising drilling orifices in a layer of the multi-layer printed circuit board assembly to effect flow restriction control.

* * * * *